US012791618B2

(12) United States Patent
Miller et al.

(10) Patent No.: US 12,791,618 B2
(45) Date of Patent: Nov. 10, 2026

(54) STORAGE DEVICE WITH ASYMMETRIC CHARGE-DISCHARGE PROFILE

(71) Applicant: Atlas Power Technologies Inc., Abbotsford (CA)

(72) Inventors: Mitchell Miller, Mission (CA); Hua Zhou, Oakville (CA); Stephen Edley, Surrey (CA); Glen Arthur Field, Abbotsford (CA); Amir Ostadi, North York (CA); Mohsen Sadeghi, Abbotsford (CA)

(73) Assignee: Atlas Power Technologies Inc., Abbotsford (CA)

( * ) Notice: Subject to any disclaimer, the term of this patent is extended or adjusted under 35 U.S.C. 154(b) by 146 days.

(21) Appl. No.: 18/970,732

(22) Filed: Dec. 5, 2024

(65) Prior Publication Data

US 2026/0160819 A1 Jun. 11, 2026

(51) Int. Cl.
*G01R 31/385* (2019.01)
*G01R 31/374* (2019.01)
(Continued)

(52) U.S. Cl.
CPC ......... *G01R 31/386* (2019.01); *G01R 31/374* (2019.01); *H01M 10/4285* (2013.01); *H01M 10/44* (2013.01)

(58) Field of Classification Search
CPC ......... Y02E 60/50; Y02E 60/10; Y02E 60/13; Y02E 70/30; Y02E 60/14; Y02E 10/56;
(Continued)

(56) References Cited

U.S. PATENT DOCUMENTS 5,198,741 A * 3/1993 Shinada .................... H02P 8/22 318/696
6,456,042 B1 * 9/2002 Kwok ....................... H02J 7/61 320/128
(Continued)

FOREIGN PATENT DOCUMENTS

CN 113985286 1/2022
CN 118777907 10/2024

OTHER PUBLICATIONS

Gupta; Designing high-performance asymmetric and hybrid energy devices via merging supercapacitive/pseudopcapacitive and Li-ion battery type electrodes; Scientific Reports; (2024)14:29277;| https://doi.org/10.1038/s41598-024-79622-6.

*Primary Examiner* — Vinh P Nguyen
(74) *Attorney, Agent, or Firm* — Damien G. Loveland; Valuetech Patent Agency Inc.

(57) ABSTRACT

Energy storage cells are typically tested with the same charge and discharge currents, and deployments of such cells are limited to these currents for safety. Herein, cyclical testing methodology determines maximum safe charge and discharge currents, which are unequal. This allows for charge-intensive deployments, which make full use of the fast charging capabilities of the cells while using less demanding discharge rates. It also allows for discharge-intensive deployments, which make full use of the fast discharging capabilities of the cells while using less demanding charge rates. A profile manager controls the deployed cells under continuous use, high duty cycling or intermittent high power demands, and may transition cells between charge-intensive, discharge-intensive and symmetric operation.

9 Claims, 19 Drawing Sheets

(51) Int. Cl.
*H01M 10/42* (2006.01)
*H01M 10/44* (2006.01)

(58) Field of Classification Search
CPC . Y02E 30/30; H01M 2004/021; H01M 4/131; H01M 10/48; H01M 8/22; H01M 2220/30; H01M 10/486; H01M 2010/4271; H01M 2300/0068; H01M 8/00; H01M 10/482; H01M 8/02; H01M 14/00; H01M 8/04552; H01M 8/04582; H01M 8/0488; H01M 10/484; G01R 31/392; G01R 31/367; G01R 31/382; G01R 31/3835; G01R 31/389; G01R 31/396; G01R 31/3842; G01R 31/3648; G01R 31/36; G01R 31/387; G01R 19/16542; G01R 31/3646; G01R 31/364; G01R 31/386
See application file for complete search history.

(56) References Cited

U.S. PATENT DOCUMENTS

| | | | | |
|---|---|---|---|---|
| 8,102,179 | B2 * | 1/2012 | Mingant .............. | G01R 31/386<br>324/426 |
| 10,712,392 | B2 * | 7/2020 | Swan .................... | G01R 31/367 |
| 12,237,690 | B2 * | 2/2025 | Miller .................... | H02J 50/001 |
| 2011/0264381 | A1 * | 10/2011 | Gering .................. | H01M 10/48<br>702/32 |

* cited by examiner

STORAGE DEVICE WITH ASYMMETRIC CHARGE-DISCHARGE PROFILE

TECHNICAL FIELD

This application relates to electrical storage devices. In particular, it relates to their testing and subsequent use in energy storage systems.

BACKGROUND

The invention and widespread adoption of renewable electricity generation have introduced significant challenges for electrical grids worldwide, particularly in managing grid reliability due to the intermittent nature of renewable energy sources. To address this issue, a variety of energy storage systems have been developed and deployed. Among these, lithium-ion energy storage systems have gained considerable attention and traction, emerging as a dominant technology in global electricity markets, with deployments now reaching gigawatt-scale capacities.

In addition to batteries, supercapacitors have emerged as a promising energy storage technology, with a chemical composition capable of delivering exceptionally high power densities. Supercapacitors are a type of power-densified energy storage device available in various compositions. One of the most prevalent compositions is the electric double layer capacitor (EDLC), which is characterized by several key features. These include a low equivalent series resistance (ESR), enabling efficient charge and discharge cycles; high cyclability with lifespans typically ranging from 1 to 2 million cycles; and a moderate energy density, typically in the range of 4 to 9 Wh/kg. These attributes make EDLCs highly suitable for applications requiring rapid energy transfer, extended service life and reliability. However, supercapacitors face inherent challenges, primarily due to internal resistance that generates heat during operation. This thermal buildup can lead to cell failures, thereby limiting their reliability and operational lifespan. Although supercapacitors offer significant advantages at the grid level, such as rapid charge-discharge cycles and high power output applications, their full potential of high power density capability remains constrained by the challenges associated with thermal buildup and the resulting possibility of cell failure.

Temperature rise during charge and discharge is commonly observed in all electrochemical and electrostatic energy storage devices, including batteries and supercapacitors. To mitigate these thermal challenges and ensure safe construction and operation, various electrical safety standards have been developed. Cell-level acceptance testing criteria form the foundation of these standards. In North America, these standards outline specific provisions for cell-level testing, with the outcomes directly impacting the certification of entire systems. The construction of these systems is inherently contingent on meeting cell-level testing requirements. To maintain compliance and secure approval from certifying organizations, designers and manufacturers of energy storage devices and systems must ensure that their products operate strictly within the certification and approval limits of the tested cells. These tests help ensure that the cell temperature remains within acceptable limits to prevent failures such as overheating or structural damage.

Due to the bi-directional nature of energy storage systems, including rechargeable batteries and supercapacitors, both of which can absorb and deliver energy, cell manufacturers typically certify their cells with symmetric or near-symmetric current ratings for charge and discharge. This approach aligns with the electrochemical properties of the cells and the testing criteria outlined in safety standards for continuous operation. Typical testing involves selecting a rated charge and discharge current and subjecting the cell to prolonged operation, typically for 500 hours (approximately 21 days). During this extended cycling, the cell temperature continues to rise until it either stabilizes at a plateau or the cell fails, resulting in certification failure.

Under these conditions, cell manufacturers have established testing criteria for their cells at or near symmetric current levels. However, the vast majority of cells are certified with fully symmetric current ratings. As a result, energy storage system designers are obligated to design their systems to operate strictly within the certified limits of the cells. Supercapacitor systems are similarly designed with symmetric current profiles and certified accordingly.

The current technology landscape for supercapacitors, when integrated into products, predominantly focuses on their linear discharge characteristics and the widely held perception that supercapacitors deliver significantly higher power capabilities than batteries. However, this perception often overlooks the inherent thermal rise characteristics of these devices, which can critically impact performance and reliability.

Manufacturers typically adhere to certification standards by testing supercapacitors under symmetric charge and discharge current profiles. To comply with these standards, manufacturers select current levels that can successfully pass certification tests while staying below thermal thresholds that could otherwise cause the devices to fail, through mechanisms such as shorting, leaking, or venting.

Various standards apply to energy storage devices depending on their application.

Supercapacitors, in particular, must achieve specific certifications when sold as individual cells or assembled into larger modules and systems, based on their intended use.

For grid-scale applications, supercapacitors are required to conform to UL810A safety and performance standards, which mandate rigorous testing procedures with defined performance criteria to determine whether a cell passes or fails certification. One critical test outlined by UL810A is continuous operation current testing, where multiple cells, as defined by the manufacturer, are operated continuously for a set duration, typically 500 hours. During this testing process the temperature of the cells rises while undergoing the continuous charge and discharge cycle. If the cell temperature exceeds the safe operating limit, the cells typically fail, which may result in events such as venting electrolyte, among other failure modes. Such failures lead to the rejection of the entire batch of cells and necessitate retesting. As symmetric charge and discharge current limits are chosen for this testing, significant limitations are imposed on the design and power ratings of energy storage systems in order to remain under the current limits imposed by the UL810A cell certification.

The charging and discharging C-ratings for lithium-ion batteries vary depending on the type of lithium-ion chemistry, the design of the battery, and its intended application. Here is an overview of typical values:

- Standard Charging (0.5 C to 1 C): Most lithium-ion batteries are charged at 0.5 C to 1 C for a balance of charging speed and battery lifespan. Example: A 1 C charging rate means a 1,000 mAh battery is charged at 1,000 mA (1-hour charge time).

- Fast Charging (1 C to 3 C or higher): Fast-charging technologies allow for higher rates, but this can increase degradation over time and generate more heat.
- Slow Charging (<0.5 C): Typically used for long-term health and safety, especially in sensitive or older batteries.
- Low-Rate Discharge, Standard Applications (0.2 C to 1 C): Common in consumer electronics and applications where energy density and longevity are priorities.
- Medium-Rate Discharge, High-Performance Applications (1 C to 5 C): Found in devices like power tools and some electric vehicles.
- High-Rate Discharge, High-Power Applications (10 C to 30 C or higher for specialized cells): Used in drones, racing vehicles, and other high-performance applications requiring bursts of power.

For example, a 10 C rate for a 1,000 mAh battery delivers 10,000 mA (10 A). There are also chemistry-specific differences. For example, LFP (lithium iron phosphate) batteries can be charged at 1 C to 3 C and discharged at up to 25 C for high power handling. NMC (nickel manganese cobalt) batteries can be charged at 0.5 C to 1 C and discharged at up to 10 C, typically less for electric vehicles. LTO (lithium titanate) batteries can be charged at 5 C to 10 C (exceptional fast-charging capability) and discharged at up to 30 C. LiPo (lithium polymer) batteries can undergo charging at 1 C to 2 C and discharging at 10 C to 50 C (often used in radio-control models).

This background is not intended, nor should be construed, to constitute prior art against the present invention.

SUMMARY OF INVENTION

The above limitations imply the use of components capable of supporting no or only small differentials between maximum charge and discharge currents. The inventor has realized that the existing battery systems lack the capability to operate with the significantly higher power capacity that can be achieved using asymmetric current differentials described herein. This restricts the flexibility and performance potential of systems made with such storage devices. The same applies to supercapacitors, which limits their ability to fully leverage the high power density and rapid charge-discharge capabilities inherent to these energy storage devices. While the traditional approach ensures safe, reliable, and certified operation, it also restricts the potential performance benefits of supercapacitors. Present systems lack the essential control mechanisms required to ensure the safe and compliant operation of asymmetric charge and discharge profiles within the certified limits of the cells. This absence of control mechanisms represents a critical gap in existing technologies.

Moreover, many of the existing systems lack the necessary control mechanisms to enable asymmetric operation with noticeable differences between maximum charge and discharge currents, for example a 2-fold difference or more. As a result, they are unable to effectively address the challenge of achieving high current differentials while maintaining an acceptable temperature plateau. This limitation becomes particularly evident during extended periods of continuous operation, high duty cycles, or intermittent use at high power levels, where thermal management and safe operation are critical.

The inventor has identified a need for a system and method that incorporate asymmetrically rated supercapacitors alongside control methods capable of enabling and managing asymmetric charge-discharge profiles. Such a system must also include advanced control mechanisms to ensure that operations remain within certified and thermally safe limits, thereby maintaining compliance with safety standards and approved certifications.

The disclosed system and method address these needs by providing asymmetrically rated supercapacitors and asymmetric supercapacitor control systems, complemented by testing methodologies to determine safe operational parameters through the evaluation of a cell's thermal plateau. Additionally, the system incorporates advanced control mechanisms to ensure safe, certified operation within the defined thermal operating range, safeguarding reliability and regulatory compliance.

The asymmetric energy storage cell and system described in this patent application offer a high current differential for asymmetric operation, providing a scalable, adaptable, and versatile solution to address key challenges. These include achieving an exceptionally high current differential in an asymmetric energy storage system while maintaining acceptable supercapacitor temperature rise and a stable thermal plateau during continuous operation, high-duty cycles, or intermittent use.

The invention employs a decoupled, independently operable asymmetric charge and discharge profile, enabling the energy storage system to function at high current levels while maintaining optimal thermal conditions for the cells and modules within the system. The invention employs the ability to alternate the higher current operation between charging and discharging phases, when considering an asymmetric profile. This results in the charge and discharge profiles being decoupled based on the ideal condition for an application. Control mechanisms are used to support this independent configuration for operation. In certain embodiments, the system incorporates temperature measurement devices to monitor the thermal conditions of individual cells, modules, and/or the overall system.

Additionally, in some embodiments, a control mechanism, such as a current-limiting algorithm, is implemented to dynamically regulate current or suspend charge and discharge operations when temperature readings exceed predefined safe limits. The control logic is specifically designed to ensure that the system operates strictly within certified, approved, or acceptable current limits and profiles, particularly asymmetric, to maintain safe operation and compliance with regulatory standards and certifications.

The system is configured to support maximum asymmetric current levels for individual cells, groups of cells, individual modules, and groups of modules. This capability is achieved by appropriately sizing critical system components, such as busbars, connectors, wiring, and power conversion systems (PCS), to enable operation up to the maximum allowable asymmetric current for a given cell or module configuration.

In additional embodiments, the system is designed and constructed to handle the maximum charge and/or discharge currents of an energy storage device, such as a supercapacitor. It incorporates control features to support various operational modes, including intermittent operation, high-duty cycles, continuous operation, or continuous operation with brief rest periods. The system can operate asymmetrically, whether with higher charge currents and lower discharge currents, or vice versa, or symmetrically with same charge and discharge currents, ensuring it remains within a defined operating temperature threshold and adheres to the specified charge and discharge profiles. These controls primarily maintain optimal thermal conditions and ensure compliance with certified and approved operating current and voltage limits.

Similar to the warm-up and conditioning processes employed during battery production to enhance lifespan, optimize operating voltage ranges, and maximize energy density, the disclosed system and method enable higher operating current ratings. This capability allows the energy storage device to operate optimally under high differential asymmetric charge and discharge current levels, whether during continuous operation with a high-duty cycle or intermittent use. The system supports absolute ratios of asymmetry ($R_{cd}$) of up to 100,000 for either charging or discharging. While possible, a ratio this high is unlikely to be used and more common uses will be in the range up to 1,000.

Additionally, the disclosed system and method define a process for achieving a high absolute current differential ($A_{cd}$) in asymmetrically rated energy storage cells. This process includes a comprehensive testing methodology to evaluate the energy storage cell, for example a supercapacitor, under various asymmetric charge and discharge current levels, spanning a defined upper and lower voltage range. The testing is designed to determine an acceptable thermal plateau at these current and voltage levels.

The testing process is designed to determine the optimal achievable discharge current for a specified duration to reach or maintain a desired thermal plateau. Similarly, the process can also be used to establish the optimal achievable charge current for a specific duration to reach or maintain a thermal plateau.

After identifying the minimum voltage for discharging and the maximum voltage for charging a cell over a defined period, the testing process further determines the optimal charge current at which the cell can operate while maintaining its temperature plateau within a predefined target range. This ensures that the cell operates safely without failure, short-circuiting, or leakage, even under high current differentials and asymmetric operation.

Depending on the asymmetric charge or discharge profile, the charge or discharge current is regulated to prevent contributing to the undesired thermal rise of the cell. In exemplary embodiments, when the current falls below the levels defined by the asymmetric profile, the cell's temperature begins to decrease. This temperature reduction can be leveraged to counteract the thermal rise experienced during the high current stage of charging or discharging.

By maintaining this balance, the cell's thermal plateau remains at or below the manufacturer's specified operating limits, thereby preventing failure, leakage, or short-circuiting. This current regulation ensures the cell operates within an acceptable temperature range, supporting its cycle life and calendar life while maintaining safety and reliability during asymmetric operation.

The asymmetric charging followed by discharging, or vice versa, is continuous for a specified duration within the defined upper and lower voltage limits and at specified current levels. For example, this testing may be conducted over 500 hours in one non-limiting scenario.

If the thermal profile of the energy storage cell increases and stabilizes within the manufacturer's acceptable operating limit without any cell failure, leakage, or short-circuiting and maintains an acceptable operating temperature that supports the cell's cycle life and calendar life, these conditions can then be documented. The system and method can subsequently present these parameters to a certifying organization to achieve certification for the specified operational parameters.

If the thermal profile of the energy storage cell increases but does not stabilize at a thermal plateau, or if the plateau exceeds the manufacturer's acceptable operating limit, or if the cell fails, leaks, shorts, or operates outside the acceptable temperature range required for an adequate cycle life or calendar life, the test system and method must be adjusted and repeated. This iterative process continues until the testing produces results that meet the manufacturer's or operator's requirements for safe and reliable operation.

This process can be utilized to determine the asymmetric charge and discharge profile required for certification or for building an energy storage system. The disclosed system and method provide the significant advantage of enabling high differentials for asymmetric charging and discharging while maintaining a safe thermal operating state.

Furthermore, this process offers a clear methodology for manufacturers to certify their cells to higher ratings in collaboration with certifying organizations. By certifying and rating energy storage cells with asymmetric profiles, the disclosed system enables the construction and safe operation of asymmetric energy storage systems that adhere to certified cell current profile limits and maintain an acceptable thermal plateau.

Since many applications for energy storage devices and systems worldwide may benefit from asymmetric operations, the disclosed system and method provide one or more of the following advantages, depending on the embodiment. These advantages include achieving a lower and more stable thermal plateau, which contributes to extended cycle and calendar life for energy storage cells. Additionally, the method enables operation at higher current levels and ratings tailored to specific application requirements, allowing for the development of more compact and efficient systems or higher output systems while maintaining the safety and longevity of the energy storage cells. The disclosed system and method, therefore, may offer substantial benefits for a wide range of energy storage applications.

The disclosed system may provide benefits by enabling the effective design of energy storage systems, including compact configurations, capable of delivering peak power at high current levels and ratings that would otherwise be unachievable under continuous symmetric charge and discharge profiles. These high currents and ratings, which are critical for certain applications, are achieved without causing the cells to overheat or fail. Additionally, the described invention ensures the safe operation of high-power energy storage devices by maintaining their operation within approved specifications and certified limits.

It should be noted that both charging and discharging contribute to the thermal rise of energy storage cells, such as supercapacitors, due to their ESR. Additionally, the thermal rise during either charging or discharging increases with higher current levels and decreases with lower currents.

The average thermal plateau, derived from the contributions of charging and discharging currents or their combination, can be used to establish an averaging range for the real-time stable thermal plateau of an energy storage cell. This approach is applicable even during asymmetric charge and discharge operations, including embodiments where high current differentials exist between the charge and discharge currents.

The described invention enables high-power energy storage devices, such as supercapacitors, to operate asymmetrically at high currents, including at the cell's maximum rated current, without experiencing failures typically associated with continuous high current operation for both charging and discharging. In an exemplary embodiment, an energy storage cell is certified asymmetrically to support a higher rated current, thereby achieving the optimal balance between power density and energy density differentials.

The usefulness of advanced designs and methods, as disclosed in this patent application, is therefore significant. Such innovations are essential to unlock the potential of supercapacitors, enabling them to operate with enhanced performance, higher power ratings, and asymmetric profiles, all while maintaining thermal stability and operational safety.

When designing grid-scale energy storage systems using energy storage devices such as supercapacitors, several critical considerations must be addressed. Key factors include the desired power output, the operational duration, and the ramping characteristics of the system, all of which are defined based on the specific application requirements. These parameters play a pivotal role in setting the specifications for the system's operation.

In addition to system-level considerations, cell characteristics and performance are equally important, as they directly influence the design of modules, including factors such as cell layout, interconnection configurations for cells and modules, and thermal management, which significantly impact module and, ultimately, system design. A holistic approach is therefore essential to ensure optimal performance and reliability across all levels of the energy storage system.

The described system and method leverage an asymmetric design for charging and discharging to maximize the available power, whether for energy absorption or delivery, while minimizing the system size for continuous or high-duty-cycle applications. Additionally, the invention provides a system and method that support symmetric or partially asymmetric designs for charging and discharging, tailored to optimize power absorption or delivery. These configurations are designed to minimize system size and are suitable for applications requiring intermittent, continuous, or high-duty-cycle operations, thereby enhancing versatility and efficiency across a wide range of use cases.

In an exemplary embodiment, the system includes cells assembled into one or more module units, which can be combined to meet specific power (watt) and energy/duration (watt-hour) requirements. This scalability allows the system to support applications ranging from small-scale deployments to large-scale power plants. The system can also be integrated with existing generators and/or electrical grids using a variety of connection methods and loading control parameters to ensure optimal performance. Energy storage systems that deploy cells that have been tested asymmetrically may find application in charging and discharging circuits for testing other cells.

In an exemplary embodiment, the energy storage devices or components are supercapacitors, which provide rapid charge and discharge capabilities. However, alternative energy storage devices, such as batteries, can be incorporated in alternative embodiments to address specific operational needs or application requirements.

The asymmetric charge and discharge operations of the energy storage system may be coordinated with a load and/or electrical grid to ensure optimal system performance. This coordination is based on maintaining the desired operating levels, which include optimal current and voltage and proper cell thermal management, ensuring the cell remains within a safe thermal plateau.

Operational parameters such as loading and running time can be defined by factors such as average load, peak load, and the duration for which a generator or load is required to operate. Similarly, the system can be configured to supply power for a specified duration as an energy storage device. Additionally, the system can function as a backup power source, providing stability and reliability for various applications.

The energy storage system is designed with a quantity of stored energy that is optimally sized to meet specific power requirements, measured in watts (W), kilowatts (kW), or megawatts (MW), and energy duration requirements, measured in watt-hours (Wh), kilowatt-hours (kWh), or megawatt-hours (MWh). In an exemplary embodiment, the sizing of the energy storage device or system is determined by factors such as the required response of the system, the maximum power and energy it must absorb or deliver for a specified duration of operation. In certain embodiments, the sizing may also be determined by the response requirements of a power generating system, particularly during maximum periods of use or peak loading events over a defined period.

In certain embodiments, the energy storage system may be sized with additional energy storage capacity, ranging from 0.1 to 3,600 watt-hours or beyond, to meet extended power output and duration requirements for various timeframes, such as an hour, a day, a week, a month, or a year.

In certain embodiments, the system and method are designed to allow stand-alone power generating systems to coordinate operations with the energy storage system, providing a system and method to optimally operate both the energy storage system and the power generating system.

In certain embodiments, the system and method are designed to allow portable power generating systems to coordinate operations with the energy storage system, providing a system and method to optimally operate both the energy storage system and the power generating system.

In certain embodiments, the system and method are designed to allow the independent or combined coordination of power generating systems and/or loads to coordinate operations of the energy storage system, providing a system and method to optimally operate the energy storage system alongside power generating systems.

In certain embodiments, the system and method provide an asymmetric energy storage system designed to coordinate with and optimize the efficiency of loads, power generating systems, and/or the electrical grid. This coordination ensures optimal performance during normal operation, whether the system is delivering electricity to loads, supporting generators, or interacting with the grid.

In certain embodiments, a preliminary requirement for the described system and method is the asymmetric certification of energy storage cells.

The present invention provides a system and method for energy storage devices, such as supercapacitors, capable of operating under asymmetrical charge-discharge profiles while maintaining safe and reliable thermal performance. A core aspect of the invention lies in its ability to define and regulate critical current levels for both charge-intensive and discharge-intensive operations, enabling a scalable and adaptable energy storage system suitable for various applications.

The invention also includes a profile manager that dynamically regulates the current levels during operation to ensure adherence to the defined profiles. By implementing advanced control strategies, the profile manager maintains the cell temperature within acceptable limits, enhancing the operational safety, efficiency, and longevity of energy storage systems.

This novel approach addresses challenges associated with traditional energy storage systems that are limited to symmetrical profiles or ratings.

This invention relates to high C-rate energy storage devices, and part of what makes the invention unique is the range of asymmetry that it supports, and the control logic that allows this operation. Though the invention primarily focusses on supercapacitors it applies to any high C-rate technologies. Traditional systems deal with lower C-rate (QV) devices (batteries) such as up to a maximum of 50 C and down to 0.1 C. For supercapacitors one typically does not describe their energy transfer rates (current) as a C-rate as they can discharge and charge much faster, and they have a varying voltage. For a battery, energy is formulated as E=QV where Q is the Ah capacity and V is the average voltage of the battery which is almost constant. To define an equivalent term for a supercapacitor, we can assume that if C-rate is calculated under constant current discharge, then, the voltage profile of the supercapacitor is linear and therefore, its average voltage is calculated as: V=(V1+V2)/2, where V1 and V2 are the start and final voltages of the supercapacitor during a full charge or discharge. Then, using this definition, the equivalent capacity (in Ah) of a supercapacitor is defined as: Q=2*E/(V1+V2). Our system has the ability to utilize both lower differentials similar to batteries, as well as large differentials that supercapacitors are capable of.

For an example, some supercapacitor cells are rated at 2.7 volt and 3,000 farad. This results in a cell that has a rating of 3.03 watt hours. These cells can discharge this energy very rapidly, in as little as a few seconds. To translate this into C-rate this example would give a C-rate of 2.25. This supercapacitor example could then be discharged, at for instance 444 C, which would result in a discharging current of 1000 from 2.7 to 0 volts for 8 seconds, without considering ESR and voltage drop. Supercapacitors are traditionally tested and certified with symmetrical charge/discharge currents of around 100 amps, which works out to a symmetrical C-rate of 36.3 C for charging and 36.3 C for discharging. Our system and method allows the full range of operation to very high currents and very high C-rates, for example, charge/discharge currents above 100 A, up to 360 A and more, and up to 500 A and more, and charge rates for supercapacitors at an equivalent of a 50 C-rate, 100 C-rate or more.

Disclosed is a method for testing a cell comprising the steps of: (a) repeatedly charging and discharging the cell with a charge current and a discharge current, wherein the charge current and the discharge current have different magnitudes; (b) determining an equilibrium temperature that the cell reaches during step (a); (c) determining that the equilibrium temperature is below a maximum temperature for the cell; (d) recording whichever of the charge current and the discharge current that has the greater magnitude as an equilibrium upper limit for the cell; and (e) recording whichever of the charge current and the discharge current that has the lower magnitude as an equilibrium threshold for the cell.

Further disclosed is a system for testing a cell comprising: a charger and discharger circuit electrically connectable to the cell; a processor; a computer readable memory storing computer readable instructions which, when executed by the processor, cause the system to: (a) repeatedly charge and discharge the cell with a charge current and a discharge current, wherein the charge current and the discharge current have different magnitudes; (b) determine an equilibrium temperature that the cell reaches during step (a); (c) determine that the equilibrium temperature is below a maximum temperature for the cell; (d) record whichever of the charge current and the discharge current that has the greater magnitude as an equilibrium upper limit for the cell; and (e) record whichever of the charge current and the discharge current that has the lower magnitude as an equilibrium threshold for the cell.

Still further disclosed is an energy storage system comprising a cell; a processor; and a computer readable memory storing a profile for the cell, wherein the profile includes a charge-intensive profile and/or a discharge intensive profile, wherein: the charge-intensive profile, when included, has a charge equilibrium upper limit and a discharge equilibrium threshold that has a smaller magnitude than the charge equilibrium upper limit; the discharge-intensive profile, when included, has a discharge equilibrium upper limit and a charge equilibrium threshold that has a smaller magnitude than the discharge equilibrium upper limit. The system includes computer readable instructions stored in the computer readable memory which, when executed by the processor, cause the energy storage system to: operate the cell according to the charge-intensive profile by charging the cell at a current not greater in magnitude than the charge equilibrium upper limit and discharging the cell at a current not exceeding the discharge equilibrium threshold; or operate the cell according to the discharge-intensive profile by discharging the cell at a current not greater in magnitude than the discharge equilibrium upper limit and charging the cell at a current not exceeding the charge equilibrium threshold; or operate the cell according to one of the charge-intensive profile and the discharge-intensive profile for multiple charge and discharge cycles then operate the cell according to the other of the charge-intensive profile and the discharge-intensive profile for multiple further charge and discharge cycles.

This summary provides a simplified, non-exhaustive introduction to some aspects of the invention, without delineating the scope of the invention.

BRIEF DESCRIPTION OF DRAWINGS

The following drawings illustrate embodiments of the invention and should not be construed as restricting the scope of the invention in any way.

DETAILED DESCRIPTION

A. Terminology

Figure 1:
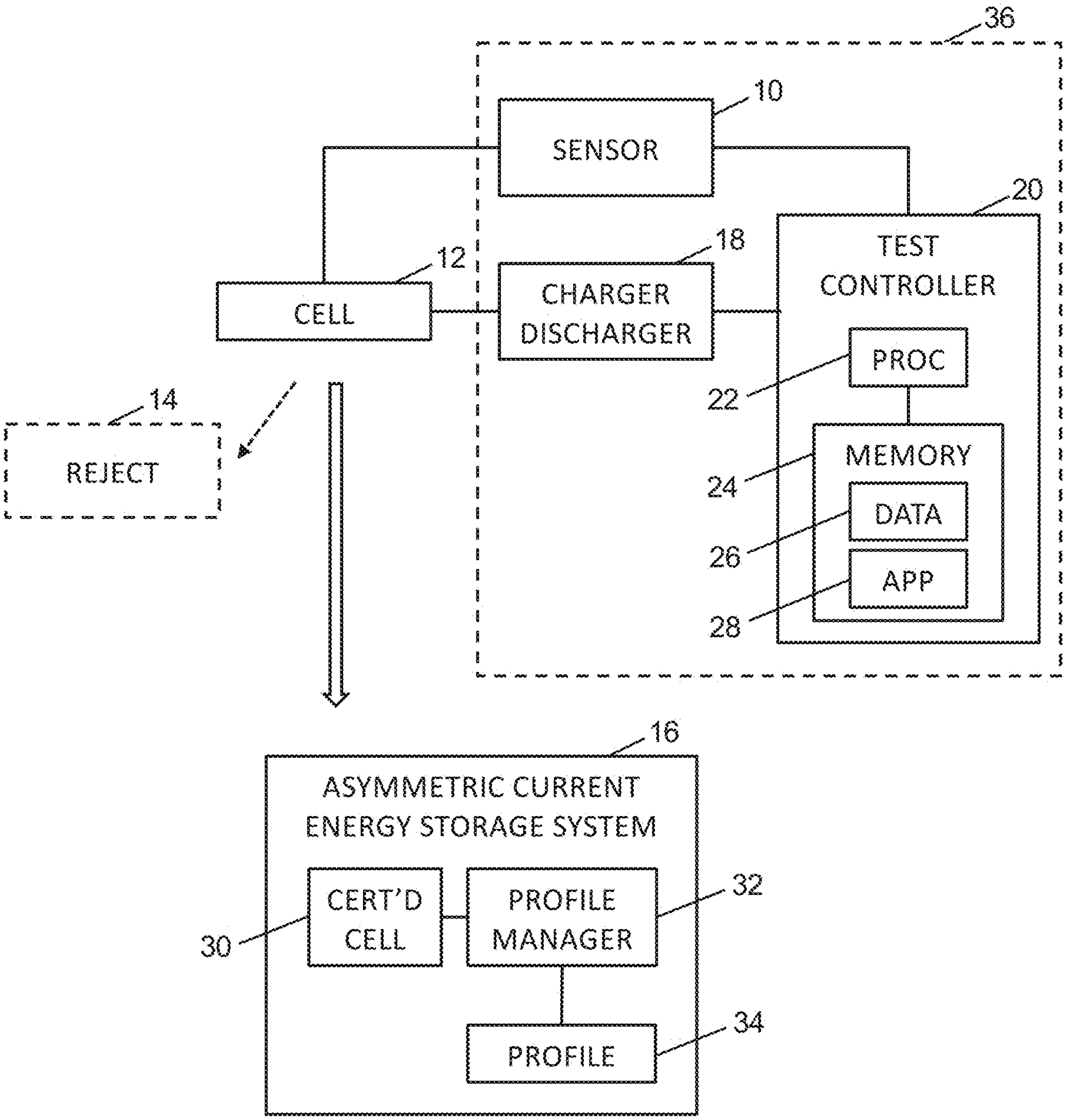
FIG. 1 is a schematic drawing of a system used for testing a cell and an asymmetric-current energy storage system, according to an embodiment of the present invention.

The invention relies on precise definitions of current levels and operational metrics to establish consistent parameters for controlling, certifying, and optimizing energy storage devices, such as supercapacitors. The following terms and metrics are defined to establish a clear foundation for understanding the operational modes, current levels, and control strategies described in this patent application.

The following current levels are defined and applied across various operational modes.

Charge Equilibrium Upper Limit, $I_{c,eq\_lim}$: The desired or nominal charge current for maintaining temperature equilibrium during charge-intensive operation.

Charge Equilibrium Threshold, $I_{c,eq\_thres}$: The maximum charge current required for equilibrium during discharge-intensive operation.

Discharge Equilibrium Upper Limit, $I_{d,eq\_lim}$: The desired or nominal discharge current (in magnitude) for maintaining temperature equilibrium during discharge-intensive operation.

Discharge Equilibrium Threshold, $I_{d,eq\_thres}$: The maximum discharge current (in magnitude) required for equilibrium during charge-intensive operation.

Maximum Charge Limit, $I_{c,max}$: The maximum allowable charge current to prevent overheating.

Maximum Discharge Limit, $I_{d,max}$: The maximum allowable discharge current to prevent overheating.

Charge Current, $I_c$: All charge currents are represented as positive values. For example, a charge current of 100 A is denoted as $I_c$=100 A.

Discharge Current, $I_d$: All discharge currents are represented as negative values. For example, a discharge current of 20 A is denoted as $I_d$=−20 A The following metrics and ratios are referenced throughout the application.

Absolute Current Differential, $A_{cd}$: The absolute value of the difference between the charge and discharge current:

$$A_{cd} = |\Delta I_{c-d}| = |I_c - I_d| \quad (1)$$

Example: if $I_c$=100 A, and $I_d$=−20 A then $$A_{cd} = |I_c - I_d| = |100 - (-20)| = 120A$$

$A_{cd}$ also represents the vertical distance on a chart between the charge current and discharge current.

Rated Absolute Current Differential, $A_{cd,rated}$: The absolute value of the difference between the rated charge and rated discharge currents:

$$A_{cd,rated} = |\Delta I_{c,rated-d,rated}| = |I_{c,rated} - I_{d,rated}| \quad (2)$$

Magnitude Differential, $M_{cd}$: The value of the difference between the absolute values of the charge current and discharge current.

$$M_{cd} = \Delta|I_{c-d}| = |I_c| - |I_d| \quad (3)$$

Example: if $I_c$=100 A, and $I_d$=−20 A then $$M_{cd} = |I_c| - |I_d| = |100| - |(-20)| = 80A$$

$M_{cd}$ may be used to determine if a charge-discharge profile is a charge-intensive profile, a discharge-intensive profile, or a symmetric charge-discharge profile.

Rated Magnitude Differential, $M_{cd,rated}$: The value of the difference between the absolute values of the rated charge current and rated discharge current.

$$M_{cd,rated} = \Delta|I_{c,rated-d,rated}| = |I_{c,rated}| - |I_{d,rated}| \tag{4}$$

Charge-to-Discharge Ratio, $R_{c/d}$: The ratio of the absolute value of the charge current to the absolute value of the discharge current:

$$R_{c/d} = \frac{|I_c|}{|I_d|} \tag{5}$$

Example: if $I_c$=100 A, and $I_d$=−20 A then $$R_{c/d} = \frac{|I_c|}{|I_d|} = \frac{|100|}{|(-20)|} = \frac{100}{20} = 5$$

Discharge-to-Charge Ratio, $R_{d/c}$: The ratio of the absolute value of the discharge current to the absolute value of the charge current:

$$R_{d/c} = \frac{|I_d|}{|I_c|} \tag{6}$$

Example: if $I_c$=100 A, and $I_d$=−20 A then $$R_{d/c} = \frac{|I_d|}{|I_c|} = \frac{|(-20)|}{|100|} = \frac{20}{100} = 0.2$$

Evidently, the discharge-to-charge ratio, $$R_{d/c} = \frac{1}{R_{c/d}}.$$

Absolute Ratio of Asymmetry, $R_{cd}$: The ratio between the greater and the lesser of the absolute values of the charge and discharge currents:

$$R_{cd} = \frac{\max\{|I_c|, |I_d|\}}{\min\{|I_c|, |I_d|\}} \tag{7}$$

Example: if $I_c$=100 A, and $I_d$=−20 A then $$R_{cd} = \frac{\max\{|I_c|, |I_d|\}}{\min\{|I_c|, |I_d|\}} = \frac{\max\{|100|, |(-20)|\}}{\min\{|100|, |(-20)|\}} = \frac{100}{20} = 5$$

Rated Absolute Ratio of Asymmetry, $R_{cd,rated}$: The ratio between the greater and the lesser of the absolute values of the rated charge and rated discharge currents:

$$R_{cd,rated} = \frac{\max\{|I_{c,rated}|, |I_{d,rated}|\}}{\min\{|I_{c,rated}|, |I_{d,rated}|\}} \tag{8}$$

The following profiles are referenced throughout the application:

Charge-Intensive Profile: The charge-discharge cyclic operation profile where $|I_c|>|I_d|$, and $M_{cd}>0$.

Discharge-Intensive Profile: The charge-discharge cyclic operation profile where $|I_c|<|I_d|$ and $M_{cd}<0$.

Symmetric Charge-Discharge Profile: The charge-discharge cyclic operation profile where $|I_c|=|I_d|$ and $M_{cd}=0$.

Other terms include the following:

AC—alternating current

AI—artificial intelligence

BMS—battery management system

The term "cell" or "energy storage cell" refers to the smallest component or unit that stores electrical energy, and may be an electrochemical cell or a supercapacitor, for example.

DC—direct current

EDLC—electric double layer capacitor

ESR—equivalent series resistance

ESS—energy storage system

The term "firmware" includes, but is not limited to, program code and data used to control and manage the interactions between the various modules of the testing system and/or energy storage system.

The term "hardware" includes, but is not limited to, discrete electric and electronic components, circuits, integrated circuits, controllers, sensors, energy storage systems and housings.

The term "module" can refer to any component in this invention and to any or all of the features of the invention without limitation. A module may be a software, firmware or hardware module, and may be located without limitation in a test controller, a profile manager or energy storage system.

PI—Proportional-integral

The term "processor" or "processing circuitry" is used to refer to any electronic circuit or group of circuits that perform calculations, and may include, for example, single or multicore processors, multiple processors, an ASIC (Application Specific Integrated Circuit), and dedicated circuits implemented, for example, on a reconfigurable device such as an FPGA (Field Programmable Gate Array). The processor performs the steps in the flowcharts, whether they are explicitly described as being executed by the processor or whether the execution thereby is implicit due to the steps being described as performed by code or a module. The processors, if multiple, may be located together or separate from each other.

The term "software" includes, but is not limited to, program code that performs the computations necessary for controlling the charging and discharging of a cell during testing, receiving and analyzing temperature data from a cell, changing the discharging and charging current levels of a cell, recording the maximum discharging and charging current levels for a cell, and controlling charging and discharging currents of a deployed cell according to a profile for the cell.

UL810A—an official performance standard for certifying electrical storage cells.

B. Exemplary Energy Storage System

Referring to FIG. 1, the disclosed system and method describe an asymmetric-current energy storage system 16 ("energy storage system" or "system" for brevity) designed for scalable energy applications, capable of operating asymmetrically during charging and discharging, with the ability to accommodate large current differentials in asymmetric operation. The system is constructed from multiple interconnected building blocks, including individual certified cells 30, modules, and grouped stacks (strings), which collectively form a complete energy storage system. Each building block serves a distinct specific role in energy storage, management, and safety.

The system comprises one or more modules. A module of the system comprises one or more energy storage devices, for instance a battery cell, a supercapacitor, pseudo capacitor, lithium-ion capacitor, ultracapacitor, lithium-ion battery or a plurality of any of these, in series and/or parallel. Other components in the module may include rigid and/or flexible busbars, liquid-cooled busbars, cell interfaces, cell balancing circuitry, terminals, connectors, switches, printed circuit boards, a battery management system (BMS), microcontrollers, computer-readable memories storing management algorithms and/or artificial intelligence (AI) algorithms, wireless and/or wired data ports, thermal couplers, panels, reinforced panels, cover panels, mounting brackets, shock absorbers, fire retardants, passive cooling devices and active cooling devices.

A group of the modules may be assembled as a stack and connected in parallel and/or series configurations, each stack optionally being individually isolatable or replaceable. The modules may be mounted on a rack, which allows for airflow and heat dissipation. There may be multiple, individually isolatable stacks in the system, isolatable by circuit breakers and/or other switchgear, and they may optionally be remote controlled. Multiple stacks may be combined in a cabinet or walk-in container with, for example, a centralized connection for grid-scale or industrial applications. This system may include a heating, ventilation and air-conditioning unit, a dehumidifier, weatherproofing, a register boot, a fire alarm panel, control lines, data lines, power lines, a DC combiner panel and power adapters such as transformers, DC/AC inverters or DC/DC converters. Other applications for the system include micro-grids, electric vehicles, back-up power, heavy machinery, mobile power units and use with a generator. A system may be rated up to 10 kA, for example.

The system may include a profile manager 32 that includes or accesses a profile 34 (operational profile) for the cell or groups of cells, or it may include multiple profiles. In certain embodiments the system is constructed to allow the system to operate at a heightened amperage by means of operation via an asymmetrical charging and discharging profile, wherein the heightened amperage would lead to failure under a symmetrical or near symmetrical charging and discharging profile. In certain embodiments the system may include an operational profile where the maximum charging amperage is greater than the maximum discharging amperage by any factor greater than 1, for example a factor of 1.5, 2, 3, 4, 5, 10, 100 or 1,000. In certain embodiments the system may include an operational profile where the maximum discharging amperage is greater than the maximum charging amperage by any factor greater than 1, for example a factor of 1.5, 2, 3, 4, 5, 10, 100 or 1,000. In certain embodiments the system may include an operational profile where either the discharging amperage or the charging amperage is greater. In certain embodiments the system may include an operational profile where either the discharging amperage or the charging amperage is greater and the system can alternate between which amperage is greater. In certain embodiments the system may include an operational profile where either the discharging amperage or the charging amperage is greater and the system can alternate between which amperage is greater and also includes a current limiter or control system to control the safe operation of charging or discharging to ensure the operation within specified limits.

In some embodiments the profile manager may include or control a BMS controller, which may be AI-enabled. In additional embodiments and complex applications, the BMS controller may incorporate AI to predictively manage charge-discharge cycles and optimize energy flow. In additional embodiments where the environment may offer extreme temperatures, the BMS may include integrated thermal management systems to regulate the temperature of individual modules.

In certain embodiments the current limiter is a program or algorithm operating in software and/or firmware. In certain embodiments the current limiter is a physical device or devices. In certain embodiments the current limiter is a program or algorithm which is combined with a physical device or devices. In certain embodiments the physical device of the current limiter may include the non-limiting examples of thermocouple(s), relay(s), resistor(s), switches, etc. In certain embodiments the current limiter is a safety system designed to safely stop the charging or discharging of the energy storage system, and may operate at the cell level, the module level or the system level.

C. Exemplary Testing System

FIG. 1 also shows a test system 36 for testing a storage device 12, such as a battery cell or supercapacitor. Multiple storage devices may be tested at the same time. The test system includes a charger and discharger circuit 18 for repeatedly charging and discharging the storage device. The test system also includes a controller 20 for controlling the charging and discharging rates and controlling the duration of the rest periods between each charge and discharge. The controller includes a processor 22 operably connected to a computer-readable memory 24 which stores computer readable instructions 28 in the form of an application, for example. Also stored in the memory is data 26, which includes testing protocols for different types of storage device, maximum allowable temperatures or maximum safe operating temperatures for different types of storage device, and results of the testing. The test system includes or is connected to one or more temperature sensors 10 positioned to monitor the can or an exterior surface temperature of the storage device as it is undergoing testing. The measured temperature of the can is fed back to the controller and is used by the controller to modify the testing parameters for the storage device. If the temperature becomes too high and the charge and/or discharge current must be lowered beyond usefulness to keep the temperature safe, then the controller aborts the test procedure for the storage device. If aborted, the storage device becomes a reject 14. If the storage device passes the test, then it is certified, as certified cell 30, and is associated with a corresponding profile 34. It may be a charge-intensive profile or a discharge-intensive profile, or, if the storage device is tested both ways it will have both a charge-intensive profile and a discharge-intensive profile.

The certified storage device may then be deployed in an energy storage system 16, in particular an energy storage system that operates the storage device asymmetrically, in either a charge-intensive profile or a discharge-intensive profile. When the storage device has both profiles, it may be deployed in an energy storage system that alternates the storage device's operation between a charge-intensive profile and a discharge-intensive profile, each for multiple charge and discharge cycles. In this way, the two different profiles are used sequentially rather than simultaneously. The energy storage system also includes a profile manager 32, which stores or has access to the profile.

D. Exemplary Testing Methodology

The flowcharts presented below provide a generalized, systematic methodology for determining the critical current levels required for asymmetric operation. Unlike individual test cases, which are tailored to specific scenarios, these flowcharts outline a replicable process applicable to a wide range of configurations and applications. The flowcharts serve as a framework to: (1) establish charge-intensive and discharge-intensive current levels; (2) ensure that energy storage cells remain within their thermal limits during continuous, high-duty cycle, or intermittent operations; and (3) standardize the testing and certification process for determining the operational limits of asymmetric profiles.

By defining these current levels, the disclosed system ensures that energy storage cells operate within their certified thermal and current limits, thereby maintaining compliance with certification standards and maximizing operational efficiency. These current levels are later utilized by the profile manager 32 to dynamically regulate the cell's charge and discharge currents during operation.

The invention outlines a structured processes for establishing the charge equilibrium upper limit ($I_{c,eq\_lim}$) and discharge equilibrium threshold ($I_{d,eq\_thres}$) for charge-intensive operation, and discharge equilibrium upper limit ($I_{d,eq\_lim}$) and charge equilibrium threshold, ($I_{c,eq\_thres}$) for discharge-intensive operation. The flowcharts standardize the testing process, ensuring that the energy storage cells operate safely within their thermal limits while delivering high power densities under asymmetric conditions. This methodology establishes the thermal plateau for energy storage cells under asymmetric current profiles; enables the certification of cells with asymmetric operating capabilities, expanding the applicability of supercapacitors to a wider range of use cases; and provides a replicable framework to optimize performance while maintaining compliance with certification standards. By introducing the flowcharts, current definitions, and control strategies, the invention establishes a foundation for certifying and operating energy storage devices with asymmetric charge-discharge profiles, unlocking higher power outputs and improving system efficiency while ensuring thermal stability and compliance.

Figure 2:
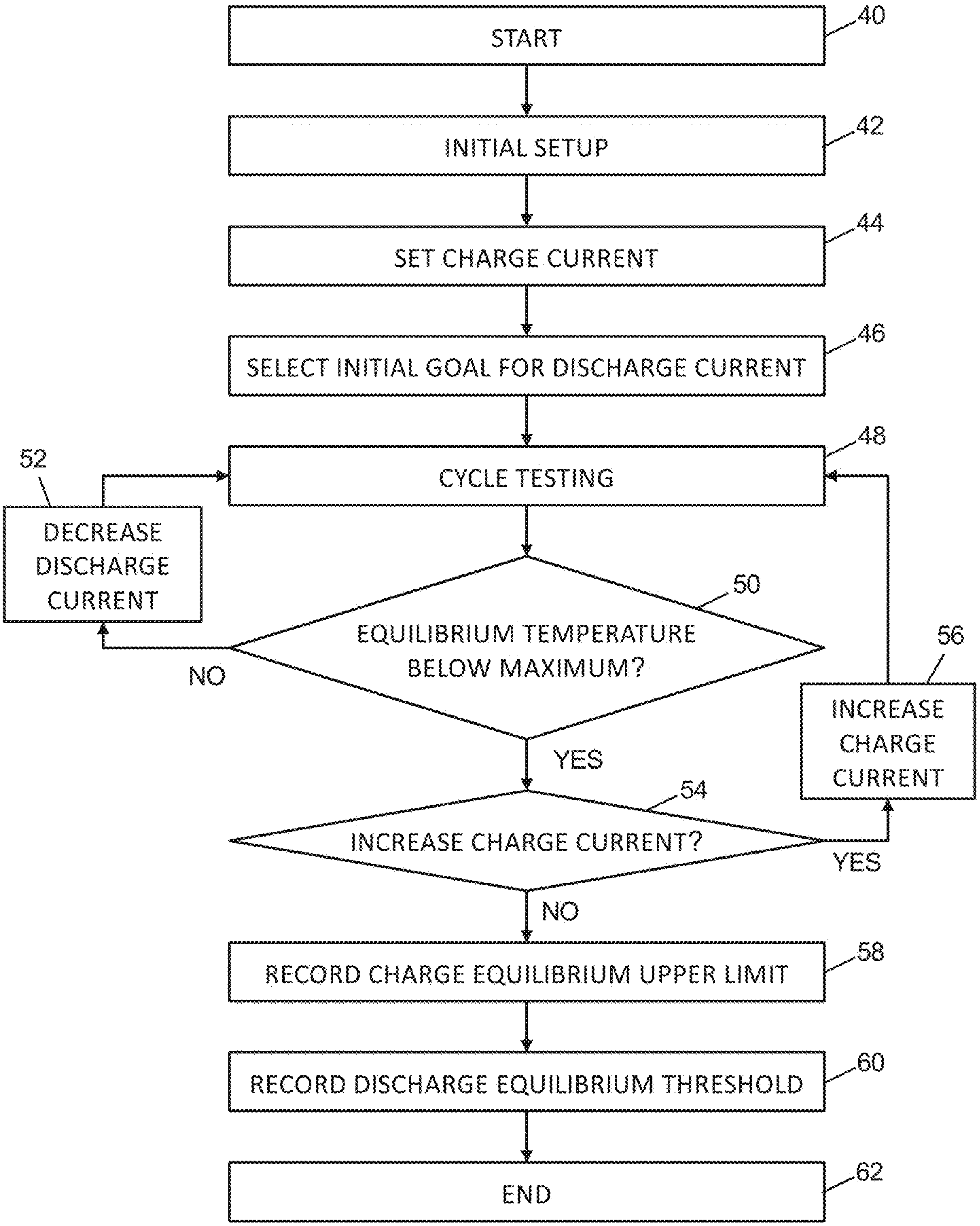
FIG. 2 is a flowchart that illustrates a process for determining charge-intensive current levels, which include the charge equilibrium upper limit ($I_{c,eq\_lim}$) and the discharge equilibrium threshold ($I_{d,eq\_thres}$), according to an embodiment of the present invention.

FIG. 2 is a flowchart that illustrates a process for determining charge-intensive current levels, which include the charge equilibrium upper limit ($I_{c,eq\_lim}$) and the discharge equilibrium threshold ($I_{d,eq\_thres}$). This method systematically adjusts the charge and discharge currents while monitoring cell temperature and thermal equilibrium, ensuring that the cell remains within a safe thermal plateau. The process begins in step 40 with a start testing process to initialize the present determination procedure for charge-intensive operation.

During the initial setup 42, the process configures the testing environment, including configuring maximum and minimum voltage limits for charging and discharging, and selects an initial charge current value based on the application requirement and safety considerations. In one non-limiting example, the upper voltage for the cell is 2.7 volts and the lower voltage is 1.2 volts. However, other combinations of upper and lower voltage limits may also be used, including an upper voltage of 3 volts and a lower voltage of 0 volts, or an upper voltage of 10 volts and a lower voltage of 0 volts. Additional configurations could include a lower voltage ranging from 0.1 volts to 10 volts or from 9.9 volts down to 0 volts. These voltage ranges and current levels are systematically tested to establish safe operational parameters while ensuring the cell achieves optimal thermal performance and stability.

In step 44 of setting the charge current, the process establishes the selected charge current value for the test cycle. This charge current may or will then later be increased incrementally as part of the testing process. In step 46 of selecting an initial goal for the discharge current, the process selects a discharge current value that is desired for the application, desired for cost-effectiveness, optionally symmetric to the selected charge current, or contributes minimally to thermal rise. Note that a lower discharge current helps reduce overall cell heating during the test cycles. In step 48 of performing cycle testing, the process cycles the cell between the configured maximum and minimum voltage limits while applying the selected charge and discharge currents. These voltage limits and charge and discharge currents may be derived from a profile specified by a standard or may simply be the testing criteria.

During the process of repeated charging and discharging, the temperature of the cell is continuously measured and monitored. In step 50 a cell temperature stabilization check is performed, in which the process checks if the cell temperature has stabilized at an equilibrium temperature below the maximum allowable operating temperature of the cell. If the temperature does not stabilize below the maximum allowable operating temperature, the process will decrease the discharge current in step 52 and repeat the testing cycle in step 48. If the cell temperature stabilizes and remains within limits, i.e. below the maximum allowable operating temperature of the cell, then the process determines whether to increase the charging current in step 54. If so, the charge current is increased in step 56. The process then reverts to step 48, in which the cell is cycled with charging and discharging currents. If the charge current can still be increased without exceeding temperature limits and a higher charge current is desired or required, the process loops back to increment the charge current through step 56. This step ensures the charge current is progressively optimized while maintaining thermal safety.

If no further increase is possible or desired, the process will proceed to record the final current levels. The maximum charge current achieved during testing, while maintaining safe thermal equilibrium, is recorded in step 58 as the charge equilibrium upper limit ($I_{c,eq\_lim}$). In step 60, the maximum discharge current that maintains the cell's thermal stability below the maximum allowable operating temperature is recorded as the discharge equilibrium threshold ($I_{d,eq\_thres}$). The testing process concludes at step 62 with both current levels having been recorded for charge-intensive operation. If $I_{c,eq\_lim}$ is below the value required for a particular application, then the cell is discarded, recycled or deployed in a less-demanding application.

Figure 3:
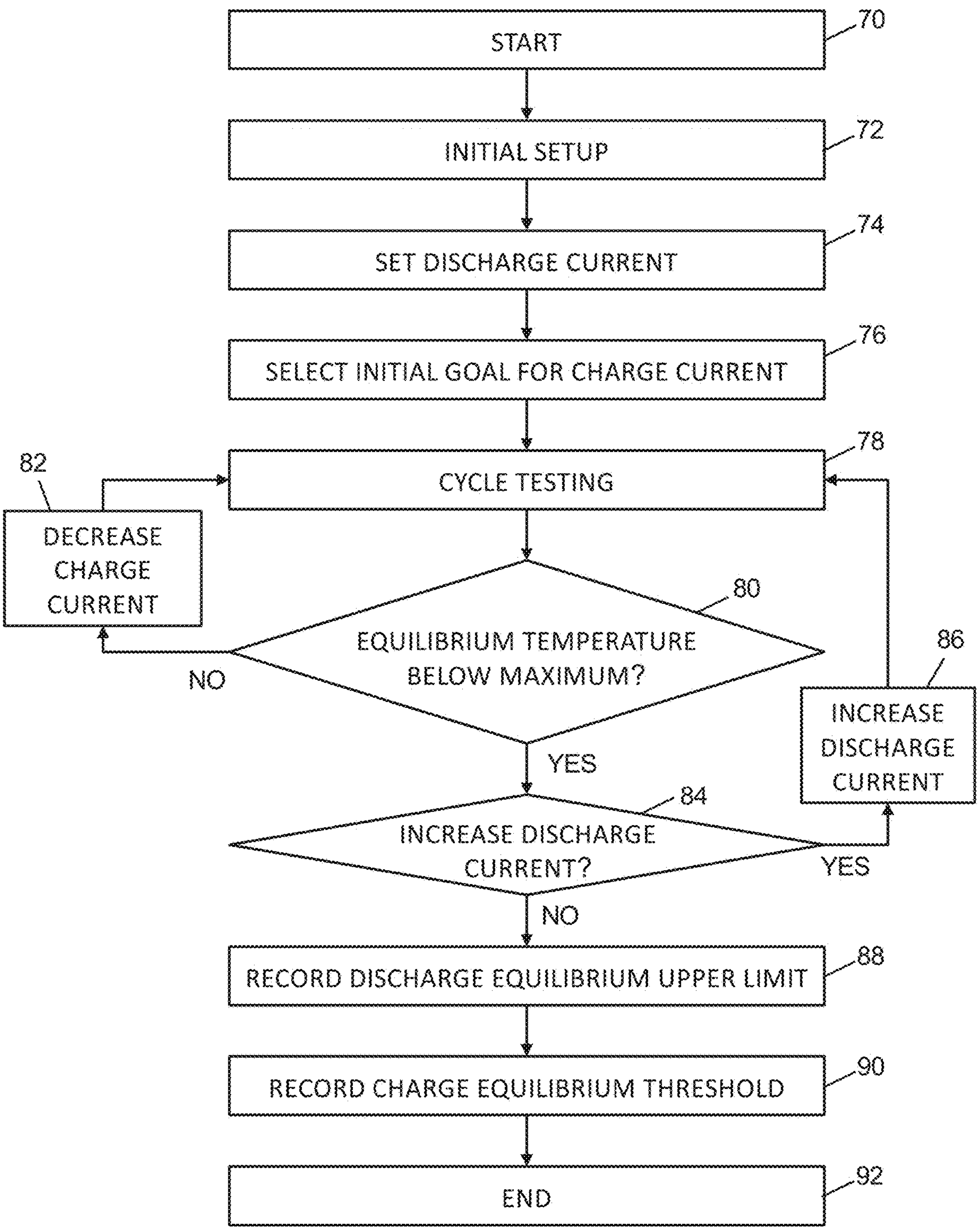
FIG. 3 is a flowchart that illustrates a process for determining discharge-intensive current levels, which include the discharge equilibrium upper limit ($I_{d,eq\_lim}$) and the charge equilibrium threshold ($I_{c,eq\_thres}$), according to an embodiment of the present invention.

FIG. 3 is a flowchart that reverses the above roles of charge and discharge currents, for now determining discharge-intensive current levels, which include the discharge equilibrium upper limit ($I_{d,eq\_lim}$) and the charge equilibrium threshold ($I_{c,eq\_thres}$), through a similar step-by-step methodology. This method systematically adjusts the charge and discharge currents while monitoring cell temperature and thermal equilibrium, ensuring that the cell remains within a safe thermal plateau. The process begins in step 70 with a start testing process to initialize the present determination procedure for discharge-intensive operation.

During the initial setup 72, the process configures the testing environment, including configuring maximum and minimum voltage limits for charging and discharging, and selects an initial discharge current value based on the application requirement and safety considerations.

In step 74 of setting the discharge current, the process establishes the selected discharge current value for the test cycle. This discharge current may or will then later be increased incrementally as part of the testing process. In step 76 of selecting an initial goal for the charge current, the process selects a charge current value that is desired for the application, desired for cost-effectiveness, symmetric to the selected discharge current, or contributes minimally to thermal rise. Note that a lower charge current helps reduce overall cell heating during the test cycles. In step 78 of performing cycle testing, the process cycles the cell between the configured maximum and minimum voltage limits while applying the selected charge and discharge currents. These voltage limits and charge and discharge currents may be derived from a profile specified by a standard or may simply be the testing criteria.

During the process of repeated charging and discharging, the temperature of the cell is continuously measured and monitored. In step 80 a cell temperature stabilization check is performed, in which the process checks if the cell temperature has stabilized at an equilibrium temperature below the maximum allowable operating temperature of the cell. If the temperature does not stabilize below the maximum allowable operating temperature, the process will decrease the charge current in step 82 and repeat the testing cycle in step 78. If the cell temperature stabilizes and remains within limits, i.e. below the maximum allowable operating temperature of the cell, then the process determines whether to increase the discharging current in step 84. If so, the discharge current is increased in step 86. The process then reverts to step 78, in which the cell is cycled with charging and discharging currents. If the discharge current can still be increased without exceeding temperature limits and a higher discharge current is desired or required, the process loops back to increment the discharge current through step 86. This step ensures the discharge current is progressively optimized while maintaining thermal safety.

If no further increase is possible or desired, the process will proceed to record the final current levels. The maximum discharge current achieved during testing, while maintaining safe thermal equilibrium, is recorded in step 88 as the discharge equilibrium upper limit ($I_{d,eq\_lim}$). In step 90, the maximum charge current that maintains the cell's thermal stability below the maximum allowable operating temperature is recorded as the charge equilibrium threshold ($I_{c,eq\_thres}$). The testing process concludes at step 92 with both current levels having been recorded for discharge-intensive operation. If $I_{d,eq\_lim}$ is below the value required for a particular application, then the cell is discarded, recycled or deployed in a less-demanding application.

In addition to being certified with individual absolute ratios of asymmetry ($R_{cd}$) between charge and discharge currents, supercapacitor cells can also be certified with specific combinations of configurations. For example, a cell may be certified for a configuration where the charge current exceeds the discharge current (which is named as "charge-intensive" with the charge-to-discharge ratio $R_{c/d}>1$) and simultaneously certified for a configuration where the discharge current exceeds the charge current (which is named as "discharge-intensive" with the charge-to-discharge ratio $R_{c/d}<1$ or discharge-to-charge ratio $R_{d/c}>1$). These certifications can be combined, enabling the cell to operate asymmetrically in both directions, alternately but not simultaneously. This dual-asymmetry certification allows for greater flexibility in energy storage applications, enabling the cell to adapt to varying operational demands while maintaining compliance with approved current profiles and thermal safety limits.

E. Exemplary Test Results

Figure 4:
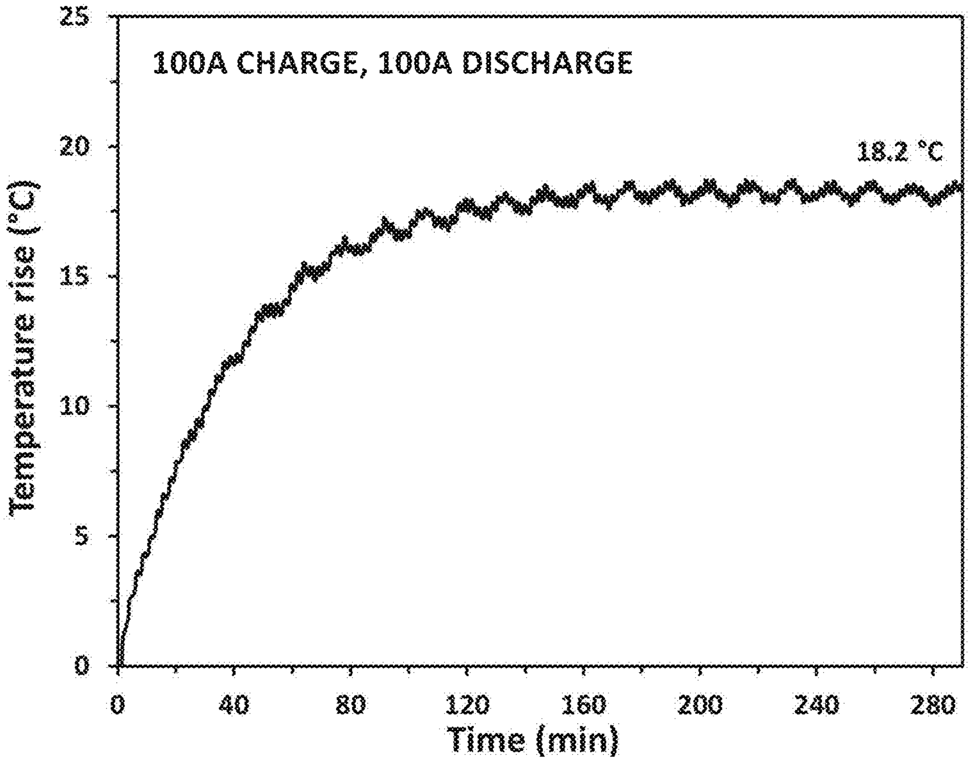
FIG. 4 is a chart depicting the normalized cell case temperature rise of a 60138 EDLC supercapacitor cell undergoing a cycling process of 100 amp charging and 100 amp discharging.

FIG. 4 is a chart that illustrates the normalized cell case temperature rise of a 60138 EDLC supercapacitor cell (3,500 F) as it undergoes a cyclic charging and discharging process. The process is conducted at a consistent 100-amp current, cycling between charging, holding, discharging, and holding again, demonstrating the cell's thermal response under sustained electrical load.

The cycling process follows a repeating pattern. The cycle begins with a 100-amp charging phase, which lasts long enough to observe the voltage of the cell reach 2.7 volts. After charging, the cell is held at the charged state for 15 seconds, during which the temperature continues to respond to the recent charge, beginning to stabilize momentarily. Following the hold, the cell undergoes a 100-amp discharge down to 1.2 volts, during which energy is drawn from the cell, creating a thermal response reflective of the discharging current. After discharging, the cell is held in a rest state for 30 seconds, allowing the temperature to adjust and momentarily stabilize before the next charge cycle. This pattern of charging, holding, discharging, and holding is repeated multiple times in the test to observe the temperature dynamics over prolonged cycling.

Temperature Rise Dynamics and Thermal Plateau: Initially, as the cycle repeats, the cell case temperature gradually rises due to the cumulative heat generated from the charging and discharging cycles. However, after several cycles, the cell reaches a thermal plateau where the temperature stabilizes, indicating an equilibrium point where heat generation and dissipation balance out. The final equilibrium temperature reached by the cell case is 18.2 degrees Celsius above the ambient temperature. This plateau represents the maximum temperature increase under the specific cycling conditions and suggests that the cell has reached a steady thermal state, where each cycle's heat contribution no longer significantly raises the temperature.

The temperature values on the chart are normalized to allow for a clear comparison of relative temperature rise without external ambient influences. This normalization is beneficial for benchmarking the cell's thermal performance under similar cycling conditions.

Figure 5:
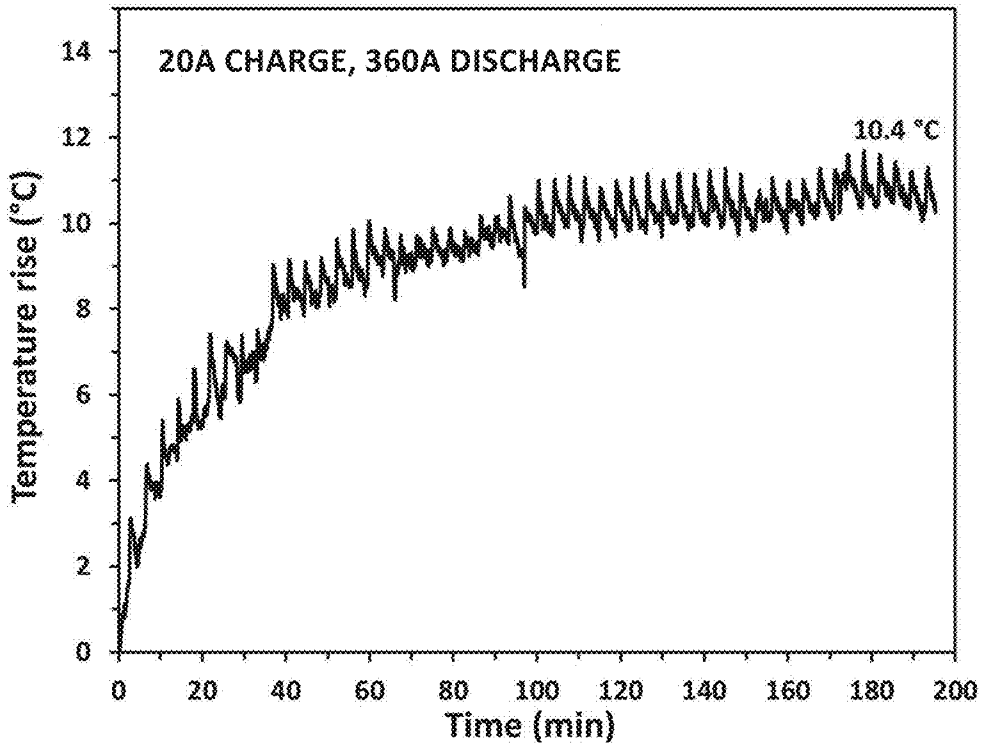
FIG. 5 is a chart depicting the normalized cell case temperature rise of a 60138 EDLC supercapacitor cell undergoing a cycling process of 20 amp charging and 360 amp discharging, according to an embodiment of the present invention.

FIG. 5 is a chart that illustrates the normalized cell case temperature rise of the 60138 EDLC supercapacitor cell as it undergoes a cyclic charging and discharging process. The cycle begins with a 20-amp charging phase, which lasts long enough to observe the cell reach 2.7 volts. After charging, the cell is held at the charged state for 15 seconds. Following the hold, the cell undergoes a 360-amp discharge down to 1.2 volts. This represents an 18-fold ratio of asymmetry ($R_{cd}$) between the charge current and discharge current. After discharging, the cell is held in a rest state for 30 seconds. The final equilibrium temperature reached by the cell case is 10.4 degrees Celsius above ambient. Even though the discharge current is 3.6 times higher than in FIG. 4, the temperature rise is 43% less. By extending the charging duration by more than the decrease in the discharge duration, the overall charge-discharge cycle time has been increased, which allows for a lower equilibrium temperature. The invention is more about increasing the current, with less concern about the overall cycle time in most applications. This is because typically either the high charge or discharge is the main action that needs to be accomplished and the corresponding recovery discharge or recharge is meant to bring the system back to a ready state for another high charge or discharge, depending on the particular application.

Figure 6:
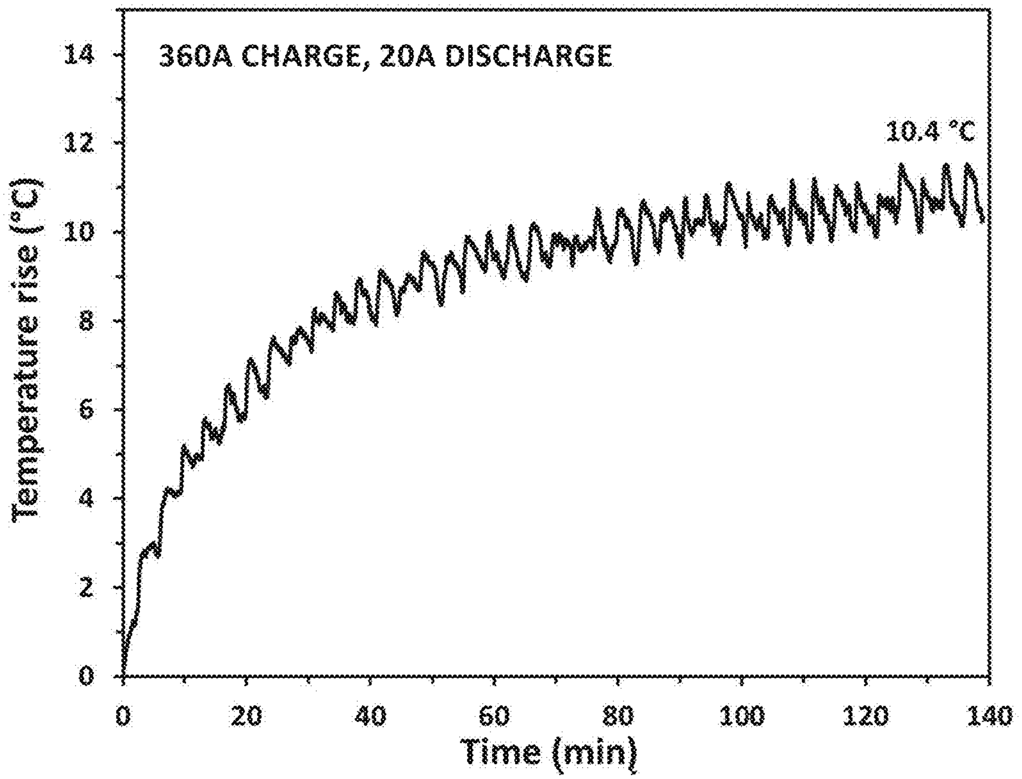
FIG. 6 is a chart depicting the normalized cell case temperature rise of a 60138 EDLC supercapacitor cell undergoing a cycling process of 360 amp charging and 20 amp discharging, according to an embodiment of the present invention.

FIG. 6 is a chart that illustrates the normalized cell case temperature rise of the 60138 EDLC supercapacitor cell as it undergoes a cyclic charging and discharging process. The cycle begins with a 360-amp charging phase, which lasts long enough to observe the cell reach 2.7 volts. After charging, the cell is held at the charged state for 15 seconds. Following the hold, the cell undergoes a 20-amp discharge down to 1.2 volts. After discharging, the cell is held in a rest state for 30 seconds. The final equilibrium temperature reached by the cell case is 10.4 degrees Celsius above ambient. Even though the charge current is 3.6 times higher than in FIG. 4, the temperature rise is 43% less.

Figure 7:
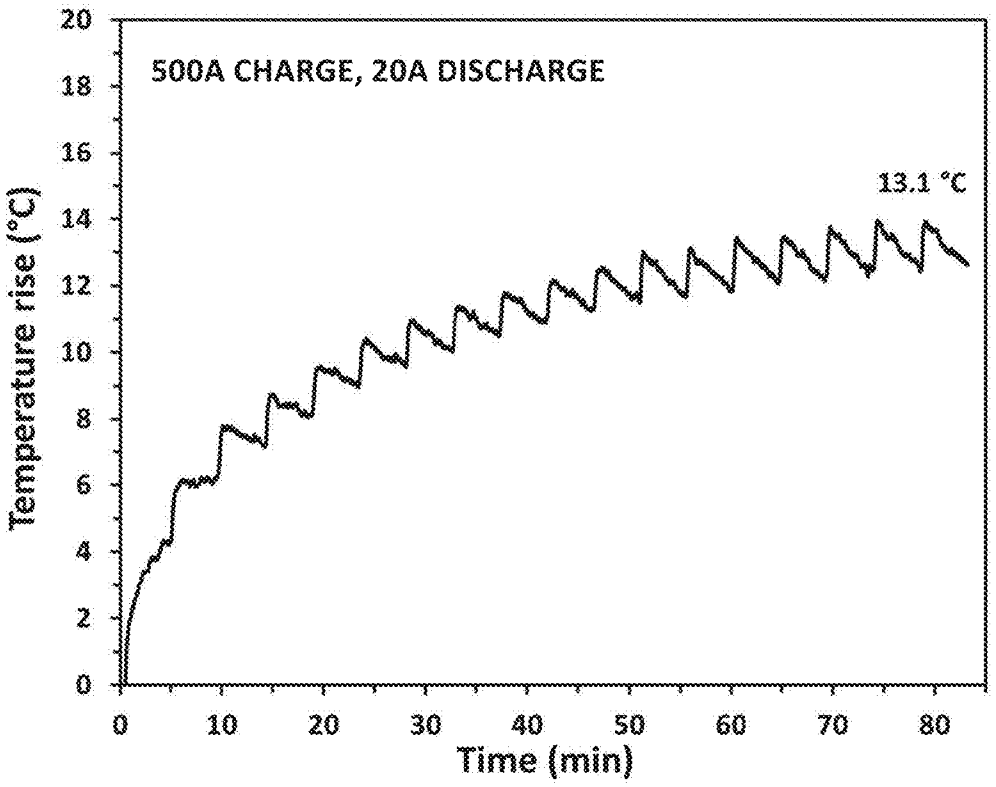
FIG. 7 is a chart depicting the normalized cell case temperature rise of a 60138 EDLC supercapacitor cell undergoing a cycling process of 500 amp charging and 20 amp discharging, according to an embodiment of the present invention.

FIG. 7 is a chart that illustrates the normalized cell case temperature rise of the 60138 EDLC supercapacitor cell as it undergoes a cyclic charging and discharging process. The cycle begins with a 500-amp charging phase, which lasts long enough to observe the cell reach 2.7 volts. After charging, the cell is held at the charged state for 15 seconds. Following the hold, the cell undergoes a 20-amp discharge down to 1.2 volts. After discharging, the cell is held in a rest state for 30 seconds. The final equilibrium temperature reached by the cell case is 13.1 degrees Celsius above ambient. Even though the current is 5 times than in FIG. 4, the temperature rise is 28% less.

During the charge and discharge process, as illustrated above, the cell temperature rises and stabilizes below the desired temperature safety/performance threshold, reaching a thermal plateau. This plateau or equilibrium is achieved by using different current values for the charge and discharge portions of the certification testing. This approach ensures that the cells can operate asymmetrically while achieving a safe thermal plateau and complying with certification standards.

The above described examples illustrate specific test cases where energy storage cells are subjected to asymmetric charge and discharge profiles. These examples highlight the practical application of the invention and its ability to operate energy storage systems safely and effectively under various asymmetric conditions.

Figure 8:
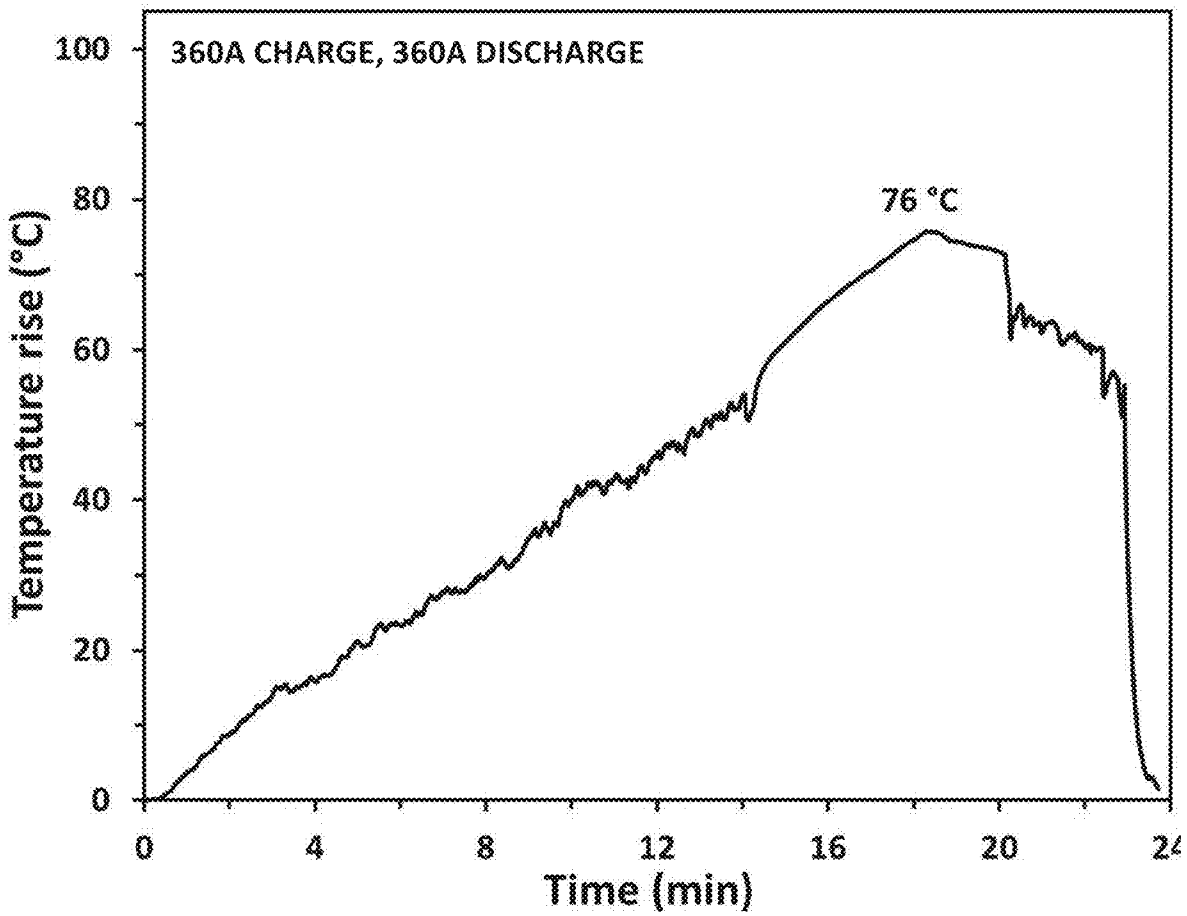
FIG. 8 is a chart illustrates the temperature rise of a 60138 EDLC supercapacitor cell as it undergoes a cyclic process of symmetric charging and discharging at a high current of 360 amps and fails.

FIG. 8, in contrast, is a chart that illustrates the cell case temperature rise of the 60138 EDLC supercapacitor cell as it undergoes a cyclic process of both charging and discharging at a high current. The cell begins with a 360-amp charging phase to reach 2.7 volts. After charging, the cell enters a 15-second hold period. Following the hold, the cell undergoes a 360-amp discharge phase down to 1.2 volts. Instead of cooling down, the temperature continues to increase, reflecting a buildup of heat due to high current flow. After discharging, the cell is held for 30 seconds, where the temperature should ideally stabilize. However, the temperature remains high and continues to climb as the cycle repeats. With each cycle, the cell temperature escalates rapidly, showing a steep upward trajectory. This abnormal rise indicates that the cell is not effectively dissipating heat, likely due to internal resistance or degradation effects, leading to thermal runaway.

Within the first 20 minutes of cycling, the cell case temperature skyrockets by 76 degrees Celsius. This rapid and uncontrolled temperature increase is a sign of critical thermal stress, suggesting the cell's inability to handle the sustained high-current cycling. At the 76-degree mark, the cell reaches a critical failure point. This could manifest as a thermal shutdown, venting, or even physical rupture. The temperature curve on the chart sharply rises to the failure point, where the cycling process abruptly ends, indicating catastrophic failure. This chart highlights the thermal limitations of the 60138 EDLC supercapacitor cell when subjected to sustained high-current cycling. The rapid temperature escalation and eventual failure suggest potential issues with heat dissipation, internal resistance, or material stability under high current loads. This behavior underlines the need for asymmetric charging and discharging thermal management strategies, and modified cycling protocols, to prevent failure in various applications.

F. Exemplary Asymmetric Cell Ratings

The following examples demonstrate the flexibility of the system in handling a wide range of asymmetric charge and discharge current levels, ensuring optimal performance and thermal safety. For example, in non-limiting scenarios:

Example 1: A cell with rated charge current ($I_{c,rated}$) of 0.1 amps and a rated discharge current ($I_{d,rated}$) at 2000 amps has the rated absolute ratio of asymmetry ($R_{cd,rated}$):

$$R_{cd,rated} = \frac{\max\{|0.1|, |(-2000)|\}}{\min\{|0.1|, |(-2000)|\}} = \frac{2000}{0.1} = 20000$$

and a rated absolute current differential ($A_{cd,rated}$):

$$A_{cd,rated} = |0.1 - (-2000)| = 2000.1(A)$$

indicating a discharge-intensive profile for the negative rated magnitude differential ($M_{cd,rated}$):

$$M_{cd,rated} = |0.1| - |(-2000)| = -1999.9(A)$$

Example 2: A cell with rated charge current ($I_{c,rated}$) of 20 amps and a rated discharge current ($I_{d,rated}$) at 2000 amps has the rated absolute ratio of asymmetry ($R_{cd,rated}$):

$$R_{cd,rated} = \frac{\max\{|20|, |(-2000)|\}}{\min\{|20|, |(-2000)|\}} = \frac{2000}{20} = 100$$

and a rated absolute current differential ($A_{cd,rated}$):

$$A_{cd,rated} = |20 - (-2000)| = 2020(A)$$

indicating a discharge-intensive profile for the negative rated magnitude differential ($M_{cd,rated}$):

$$M_{cd,rated} = |20| - |(-2000)| = -1980(A)$$

Example 3: A cell with rated charge current ($I_{c,rated}$) of 20 amps and a rated discharge current ($I_{d,rated}$) at 360 amps has the rated absolute ratio of asymmetry ($R_{cd,rated}$):

$$R_{cd,rated} = \frac{\max\{|20|, |(-360)|\}}{\min\{|20|, |(-360)|\}} = \frac{360}{20} = 18$$

and a rated absolute current differential ($A_{cd,rated}$):

$$A_{cd,rated} = |20 - (-360)| = 380(A)$$

indicating a discharge-intensive profile for the negative rated magnitude differential ($M_{cd,rated}$):

$$M_{cd,rated} = |20| - |(-360)| = -340(A)$$

Example 4: A cell with rated charge current ($I_{c,rated}$) of 500 amps and a rated discharge current ($I_{d,rated}$) at 20 amps has the rated absolute ratio of asymmetry ($R_{cd,rated}$):

$$R_{cd,rated} = \frac{\max\{|500|, |(-20)|\}}{\min\{|500|, |(-20)|\}} = \frac{500}{20} = 25$$

and a rated absolute current differential ($A_{cd,rated}$):

$$A_{cd,rated} = |500 - (-20)| = 520(A)$$

indicating a charge-intensive profile for the positive rated magnitude differential ($M_{cd,rated}$):

$$M_{cd,rated} = |500| - |(-20)| = 480(A)$$

Example 5: A cell with rated charge current ($I_{c,rated}$) of 1000 amps and a rated discharge current ($I_{d,rated}$) at 200 amps has the rated absolute ratio of asymmetry ($R_{cd,rated}$):

$$R_{cd,rated} = \frac{\max\{|1000|, |(-200)|\}}{\min\{|1000|, |(-200)|\}} = \frac{1000}{200} = 5$$

and a rated absolute current differential ($A_{cd,rated}$):

$$A_{cd,rated} = |1000 - (-200)| = 1200(A)$$

indicating a charge-intensive profile for the positive rated magnitude differential ($M_{cd,rated}$):

$$M_{cd,rated} = |1000| - |(-200)| = 800(A)$$

G. Exemplary Profiles

The relationships between the six current levels, $I_{c,max}$, $I_{c,eq\_lim}$, c,eq_thres, d, max, d,eq_lim, $I_{d,eq\_thres}$, are established during the processes described in FIGS. 2 and 3, taking into account that the currents should be below the corresponding $I_{c,max}$ and $I_{d,max}$. These relationships can be categorized into two distinct configurations: asymmetric configuration and symmetric configuration.

In the asymmetric configuration, the energy storage cell operates with profiles that emphasize either charging (charge-intensive) or discharging (discharge-intensive), creating an intentional imbalance between charge and discharge currents. This configuration supports high current differentials, enabling flexible operation while maintaining thermal safety. The relationships between current levels in this configuration are:

For a charge-intensive profile:

$$|I_{c,max}| > |I_{c,eq\_lim}| > |I_{d,eq\_thres}| \tag{9}$$

This configuration prioritizes higher charge current while maintaining a controlled discharge current to optimize thermal performance and longevity. It is used for applications that predominantly charge faster than they discharge.

For a discharge-intensive profile:

$$|I_{d,max}| > |I_{d,eq\_lim}| > |I_{c,eq\_thres}| \tag{10}$$

This configuration prioritizes higher discharge currents while maintaining a controlled charge current to optimize thermal performance and longevity. It is used for applications that predominantly discharge faster than they charge.

Additionally, the equilibrium levels follow these conditions for asymmetric configurations:

$$|I_{c,eq\_lim}| > |I_{c,eq\_thres}| \tag{11}$$

$$|I_{d,eq\_lim}| > |I_{d,eq\_thres}| \tag{12}$$

In the symmetric configuration, the energy storage cell operates with equal emphasis on charging and discharging, resulting in balanced operation. It is suitable for applications requiring consistent performance and equal current levels for charging and discharging. The relationships between current levels in this configuration are:

$$|I_{c,max}| > |I_{c,eq\_lim}| = |I_{d,eq\_thres}| \tag{13}$$

$$|I_{d,max}| > |I_{d,eq\_lim}| = |I_{c,eq\_thres}| \tag{14}$$

$$|I_{c,eq\_lim}| = |I_{d,eq\_lim}| = |I_{c,eq\_thres}| = |I_{c,eq\_thres}| \tag{15}$$

In this symmetric configuration, both charge and discharge currents are equal in magnitude.

To summarize, asymmetric configurations support the described charge-intensive and discharge-intensive profiles, enabling high current differentials while maintaining safe thermal operation. They support applications that demand high charge or discharge currents relative to one another, providing operational flexibility while ensuring thermal safety through controlled current levels. The symmetric configuration supports balanced operations, often suitable for applications requiring equal charge and discharge rates. All configurations may form the basis for defining rated operational modes, current profiles, and the control strategies implemented via the profile manager. They are useful for enabling tailored energy storage solutions that meet the unique demands of diverse applications.

Building on the defined configurations of current levels, the following rated charge-discharge profiles illustrate specific operational modes of the energy storage system. These profiles include rated charge-intensive profiles, rated discharge-intensive profiles, and rated symmetric charge-discharge profiles. Each profile corresponds to specific current configurations optimized for distinct operational modes.

Rated Charge-Intensive Profile: When the current levels are configured as an asymmetric configuration, the energy storage cell can have a rated profile as a charge-intensive profile, characterized by a higher maximum charge current compared to maximum discharge current. The rated currents are defined as:

$$I_{c,rated} = I_{c,eq\_lim} \tag{16}$$

$$I_{d,rated} = I_{d,eq\_thres} \tag{17}$$

Given the relationships established in equations (9), (16), and (17), this profile satisfies:

$$|I_{c,rated}| > |I_{d,rated}| \tag{18}$$

The rated magnitude differential for this configuration is positive:

$$M_{cd,rated} > 0 \tag{19}$$

and this positive $M_{cd,rated}$ results in a rated charge-intensive profile, suitable for applications prioritizing charging operations.

Figure 9:
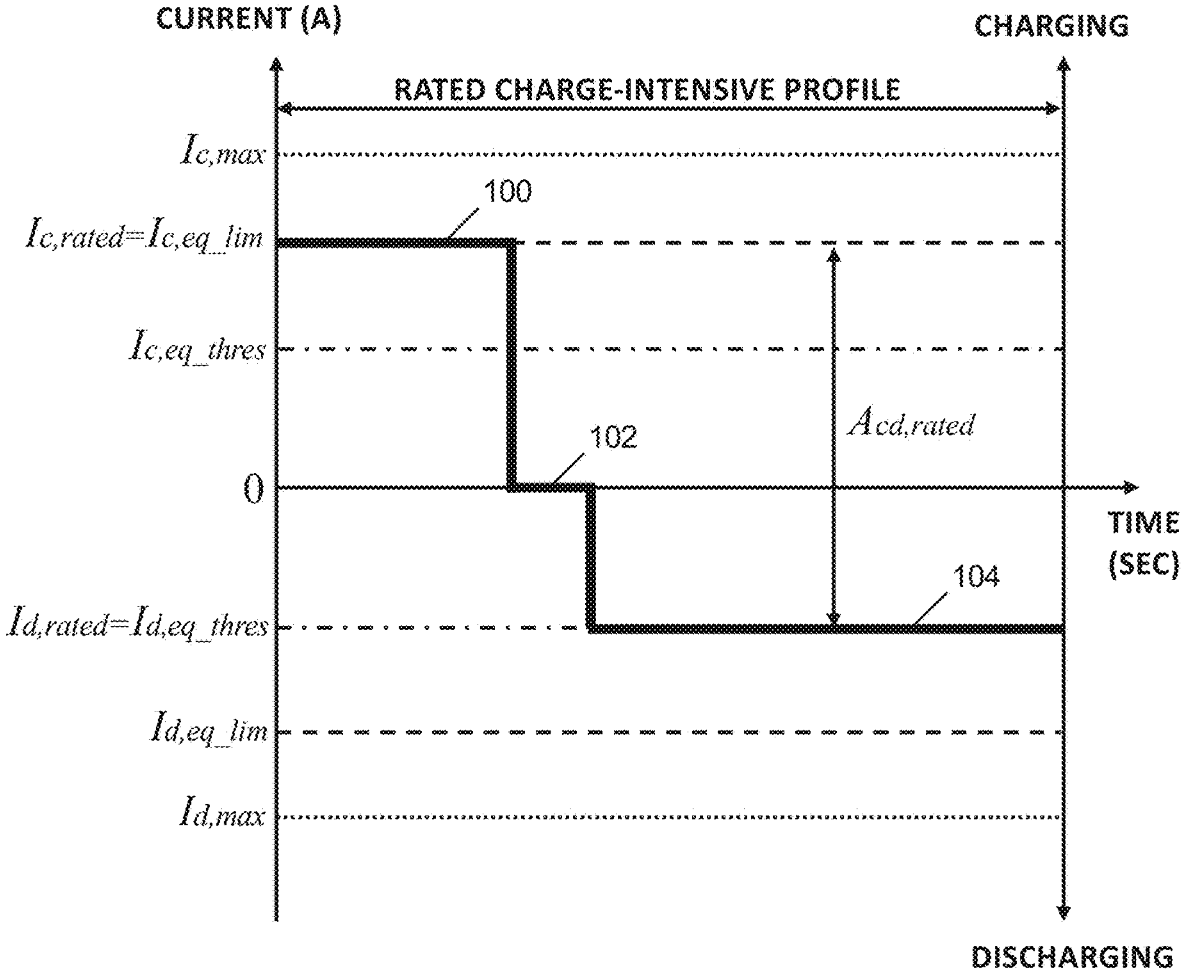
FIG. 9 illustrates a standard rated charge-intensive profile, according to an embodiment of the present invention.

FIG. 9 illustrates a standard rated charge-intensive profile. An important detail depicted in this figure is the 15-second wait period 102 between the charge phase 100 and discharge phase 104, in accordance with the requirements of UL810A. This wait period contributes to thermal stabilization and prevents abrupt transitions that could otherwise compromise cell integrity or performance. By integrating this standard into the methodology, the system complies with existing regulatory guidelines while maintaining the stability and safety of the supercapacitor operation Rated Discharge-Intensive Profile: When the current levels are configured as an asymmetric configuration, the energy storage cell can have a rated profile as a discharge-intensive profile, characterized by a higher discharge current compared to charge current. The rated currents are defined as:

$$I_{c,rated} = I_{c,eq\_thres} \tag{20}$$

$$I_{d,rated} = I_{d,eq\_lim} \tag{21}$$

Given the relationships established in equations (10), (20), and (21), this profile satisfies $$|I_{c,rated}| < |I_{d,rated}| \tag{22}$$

The rated magnitude differential for this configuration is negative:

$$M_{cd,rated} < 0 \tag{23}$$

and this negative $M_{cd,rated}$ results in a rated discharge-intensive profile, suitable for applications prioritizing discharging operations.

Figure 10:
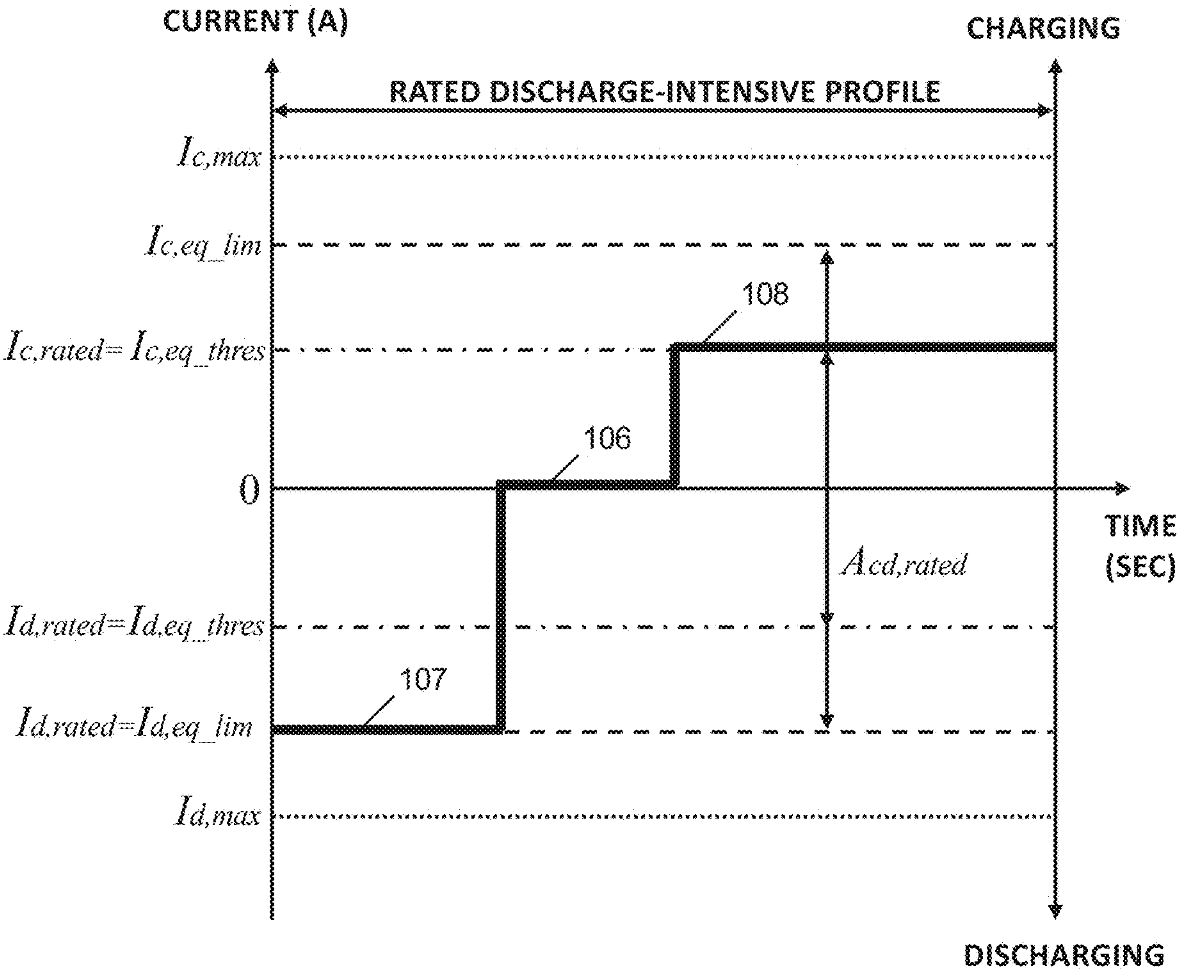
FIG. 10 illustrates a standard rated discharge-intensive profile, according to an embodiment of the present invention.

FIG. 10 illustrates a standard rated discharge-intensive profile. An important detail depicted in this figure is the 30-second wait period 106 between the charge phase 107 and discharge phase 108, in accordance with the requirements of UL810A. This wait period contributes to thermal stabilization and prevents abrupt transitions that could otherwise compromise cell integrity or performance. By integrating this standard into the methodology, the system complies with regulatory guidelines while maintaining the stability and safety of the supercapacitor operation.

Rated Symmetric Charge-Discharge Profile: When the current levels are configured as a symmetric configuration, the energy storage cell can have a rated profile as symmetric charge-discharge profile, characterized by equal charge and discharge currents. The rated currents are defined as:

$$I_{c,rated} = I_{c,eq\_lim} \tag{24}$$

$$I_{d,rated} = I_{d,eq\_lim} \tag{25}$$

Given the relationships established in equations (15), (24), and (25), this profile satisfies:

$$|I_{c,rated}| = |I_{d,rated}| \tag{26}$$

The rated magnitude differential for this configuration is zero:

$$M_{cd,rated} = 0 \tag{27}$$

and this $M_{cd,rated}$ of 0 results in a rated symmetric charge-discharge profile, suitable for applications requiring balanced charging and discharging currents.

Figure 11:
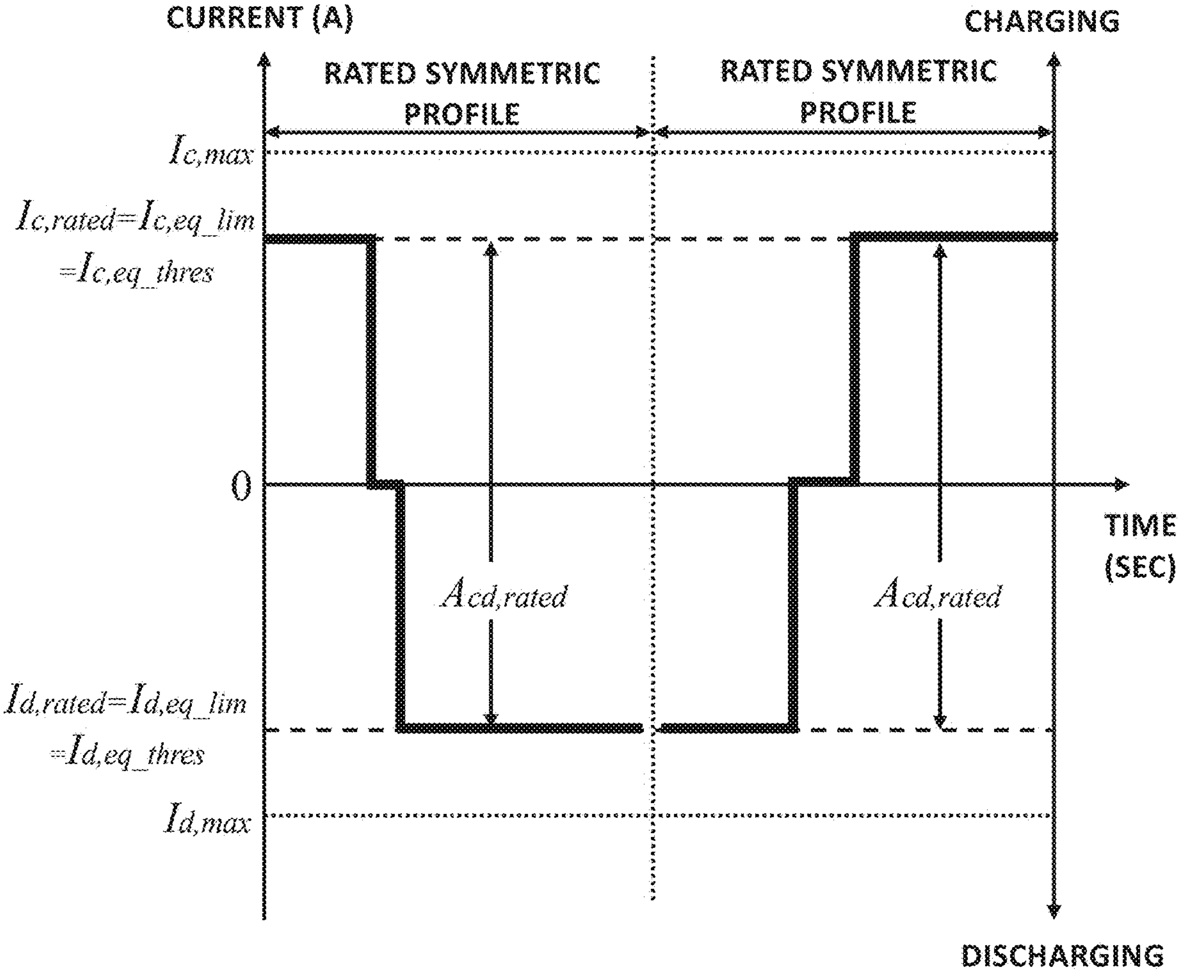
FIG. 11 illustrates a standard rated symmetric charge-discharge profile.

FIG. 11 illustrates a standard rated symmetric charge-discharge profile. This figure shows the transitions between charge and discharge cycles while maintaining compliance with UL810A requirements. Two essential wait periods are incorporated to ensure safe operation and thermal stabilization during transitions: 1) a 30-second wait period for the transition from discharge to charge cycles, allowing the system to stabilize thermally and prevent abrupt changes that could affect cell performance, and 2) a 15-second wait period for the transition from charge to discharge cycles, also mandated by UL810A, ensuring a smooth and safe transition. The symmetry refers to the equal magnitudes of the maximum charge and maximum discharge currents, not the wait periods between charging and discharging. However, in some embodiments these wait periods are equal.

H. Exemplary Profile Manager

The profile manager is implemented as a critical component of the energy storage system, designed to regulate the charge current ($I_c$) and discharge current ($I_d$) during cyclic charge-discharge operations. By leveraging predefined profiles, and/or the real-time feedback readings from temperature measurement devices, the profile manager ensures that the cells operate within their safe thermal and electrical limits while optimizing performance. The profile manager is specifically designed to adapt to the diverse operational needs of energy storage systems, such as asymmetric or symmetric charge and discharge requirements, ensuring long-term reliability and thermal stability.

At its core, the profile manager defines and enforces operational profiles tailored to the unique characteristics and configurations of each energy storage device, including charge-intensive, discharge-intensive, and symmetric charge-discharge profiles. These profiles are derived from rigorous testing and evaluation processes outlined in this patent, as well as real-time feedback from the system's sensors. The profile manager is designed to be scalable and modular, capable of operating at different levels of energy storage systems:

- Cell management: direct control of individual cells, such as via a BMS
- Module management: regulation of grouped cells in a single module to manage internal cell dynamics
- String level management: managing multiple modules in series or parallel configurations
- ESS management: Such as through an energy management system (EMS), overseeing the entire energy storage system.

This flexibility allows the profile manager to be deployed at various stages of energy management, from individual cell management to full system-level oversight. Its adaptability ensures compatibility with a wide range of energy storage applications, from grid-scale installations to standalone systems, addressing both high-power and high-energy requirements.

To meet diverse application needs, the profile manager can be implemented using one of two control strategies, namely a sensorless profile manager or profile manager with temperature sensor.

Figure 12:
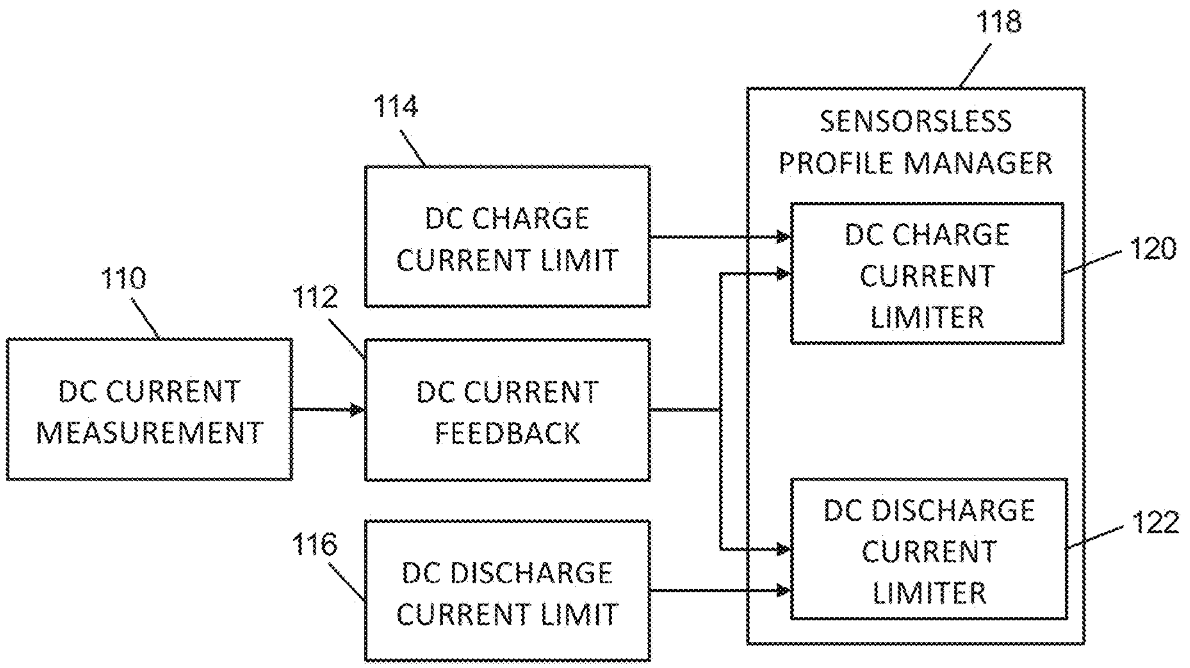
FIG. 12 demonstrates an exemplary architecture of a sensorless profile manager, according to an embodiment of the present invention.

FIG. 12 demonstrates an exemplary architecture of a sensorless profile manager 118, showing the DC current measurement 110 of the cell providing current feedback 112 and connected to the charge current limiter 120 and discharge current limiter 122. The sensorless profile manager regulates the charge current ($I_c$) and discharge current ($I_d$) using feedback mechanisms based solely on DC current feedback 112, predefined charge current limit 114 and predefined discharge current limit 116, both as defined by the profile. The charge current limiter 120 and discharge current limiter 122 are implemented utilizing control algorithms such as proportional-integral (PI) control to ensure currents stay within their defined limits to maintain operational stability. This method operates without direct temperature feedback, relying solely on DC current feedback and predefined charge/discharge current limits with fewer input parameters.

Figure 13:
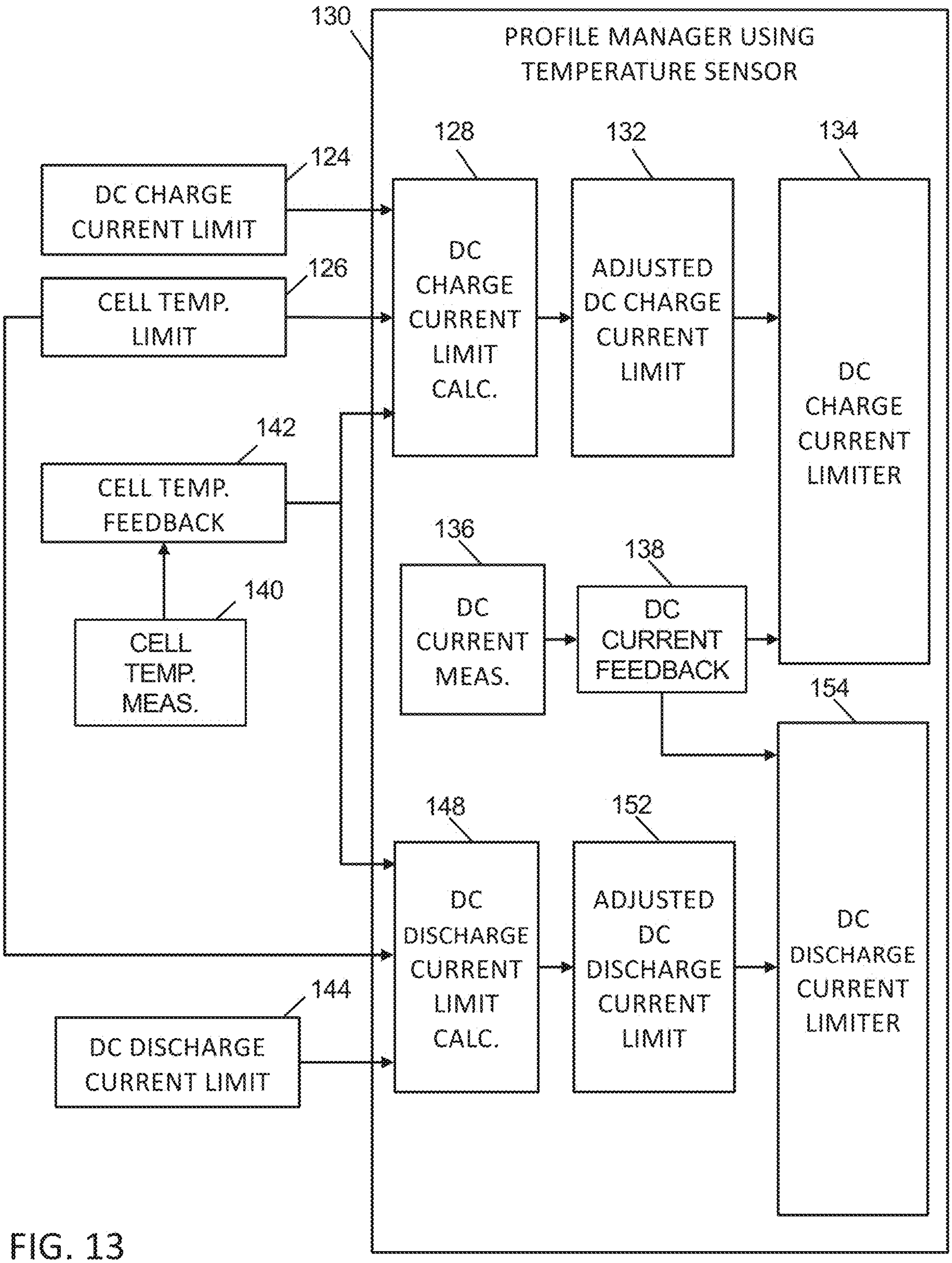
FIG. 13 shows the architecture of the profile manager with temperature sensor, according to an embodiment of the present invention.

FIG. 13 shows the architecture of the profile manager 130 with a temperature sensor. The profile manager takes a basis input from predefined DC charge current limit 124 and predefined DC discharge current limit 144. The profile manager also takes a basis input from predefined cell temperature limit 126. The profile manager integrates cell temperature feedback 142 from cell temperature measurements 140 into the DC charge current limit calculator 128 to dynamically adjust the charge limit 132. The system also integrates cell temperature feedback 142 from cell temperature measurements 140 into the DC discharge current limit calculator 148 to dynamically adjust the discharge limit 152. The profile manager also regulates the charge current ($I_c$) and discharge current ($I_d$) using feedback mechanisms 138 based on DC current measurements 136. Adjusted DC charge current limits 132 and adjusted DC discharge current limits 152 are then applied to the charge current limiter 134 and discharge current limiter 154 respectively, to optimize performance. The profile manager with temperature sensor incorporates dynamic feedback mechanisms, including cell temperature measurements 140, to adjust charge and discharge current limits in real time via DC charge current limit calculator 128 and DC discharge current limit calculator 148. It actively monitors the cell's thermal conditions and employs PI control or similar algorithms to ensure safe operation under varying load conditions. The charge current limiter 134 and discharge current limiter 154 are implemented utilizing PI control or similar algorithms to ensure currents stay within their defined limits maintain operational stability.

By incorporating both strategies, the profile manager offers a flexible solution tailored to the specific needs of the energy storage system. While the sensorless profile manager provides a straightforward approach, the profile manager with temperature sensor enhances safety and performance through advanced temperature-adaptive control. TABLE 1 provides a comparison between the two types of control strategy.

TABLE 1

| Feature | Sensorless Profile Manager | Profile Manager with Temperature Sensor |
|---|---|---|
| Feedback Mechanism | DC current feedback only | DC current and temperature feedback |
| Complexity | Simpler, with fewer inputs | More complex due to additional temperature feedback |
| Adaptability to Thermal Changes | Limited, relies on predefined limits | Highly adaptive to real-time temperature data |

TABLE 1-continued

| Feature | Sensorless Profile Manager | Profile Manager with Temperature Sensor |
|---|---|---|
| Precision | Suitable for charge/discharge regulation without temperature sensors | Provides precise control for thermal stability |

I. Exemplary Cell Operation with Rated Profiles

Energy storage cells are configured based on their current levels to have various rated profiles tailored to specific applications. These rated profiles optimize performance while maintaining thermal stability and compliance with predefined safety standards. The following categories describe the operation of energy storage cells under specific rated profiles.

Figure 14:
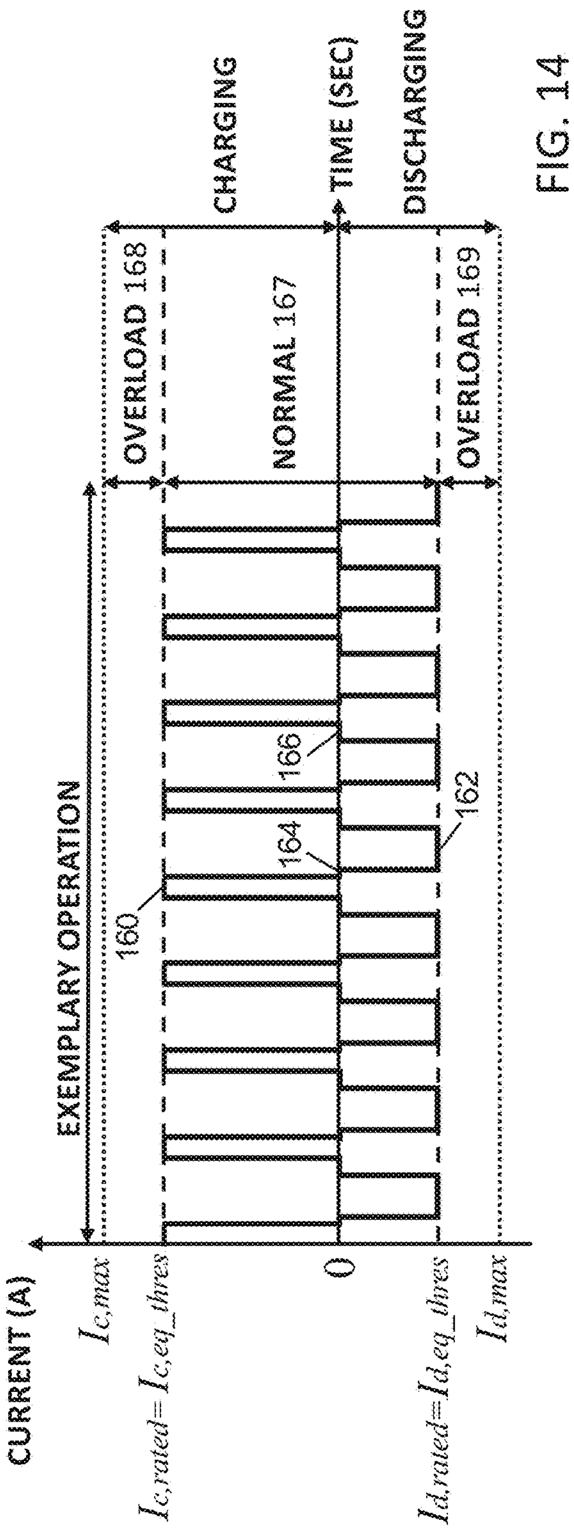
FIG. 14 illustrates energy storage cell operation with a solo rated charge-intensive profile, according to an embodiment of the present invention.

Energy Storage Cell with a Solo Rated Charge-Intensive Profile: In this configuration, the energy storage cell is configured exclusively with a rated charge-intensive profile, where the rated charge and discharge currents are defined by equations (16) and (17). This profile prioritizes higher charge currents relative to discharge currents, optimizing the cell for charge-intensive operations or applications. FIG. 14 illustrates exemplary operation of an energy storage cell with a solo rated charge-intensive profile. The cell undergoes multiple charges 160 and multiple discharges 162, cyclically. There is a wait period 164 after each charge and another wait period 166 after each discharge. The cell is shown to operate with currents in the normal operating range 167. If the charging rate were higher, the cell would operate in the overload range 168. If the discharging rate were higher, the cell would operate in the overload range 169.

Figure 15:
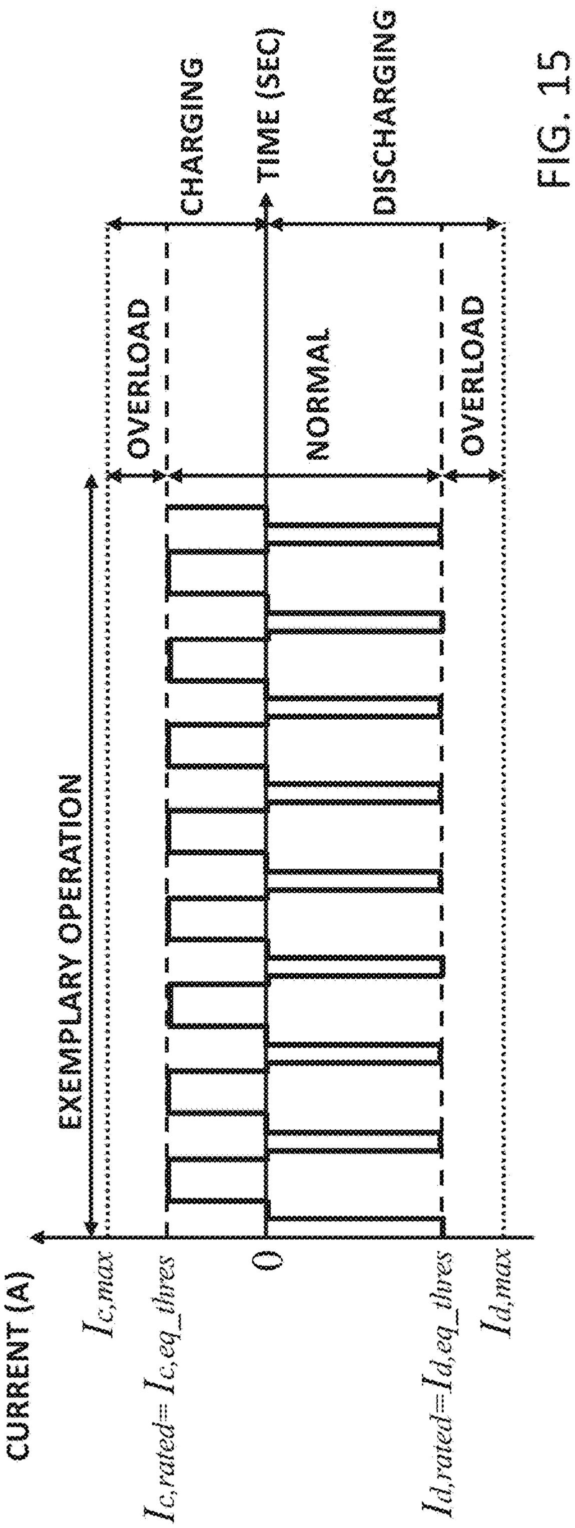
FIG. 15 illustrates energy storage cell operation with a solo rated discharge-intensive profile, according to an embodiment of the present invention.

Energy Storage Cell with a Solo Rated Discharge-Intensive Profile: In this configuration, the energy storage cell is configured exclusively with a rated discharge-intensive profile, where the rated charge and discharge currents are defined by equations (20) and (21). This profile prioritizes higher discharge currents relative to charge currents, optimizing the cell for discharge-intensive operations or applications. FIG. 15 illustrates operation of an energy storage cell with a solo rated discharge-intensive profile.

Figure 16:
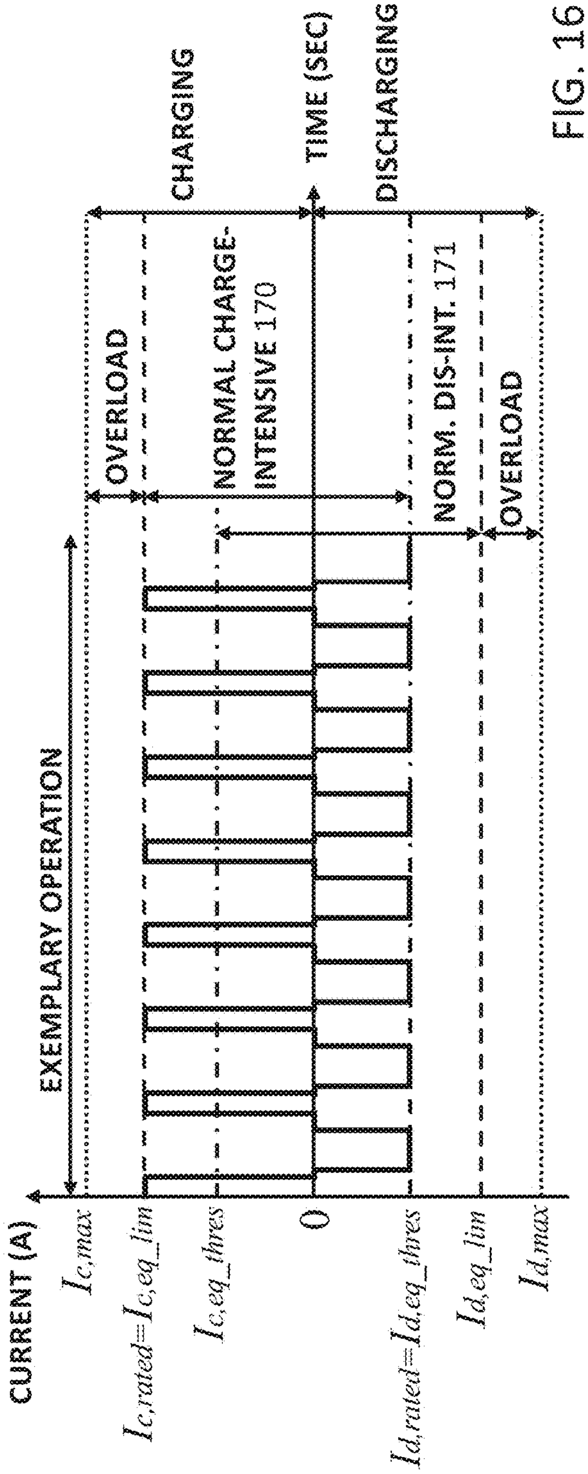
FIG. 16 illustrates a charge-intensive operation with a bi-directional rated charge-intensive and discharge-intensive profile, according to an embodiment of the present invention.
Figure 17:
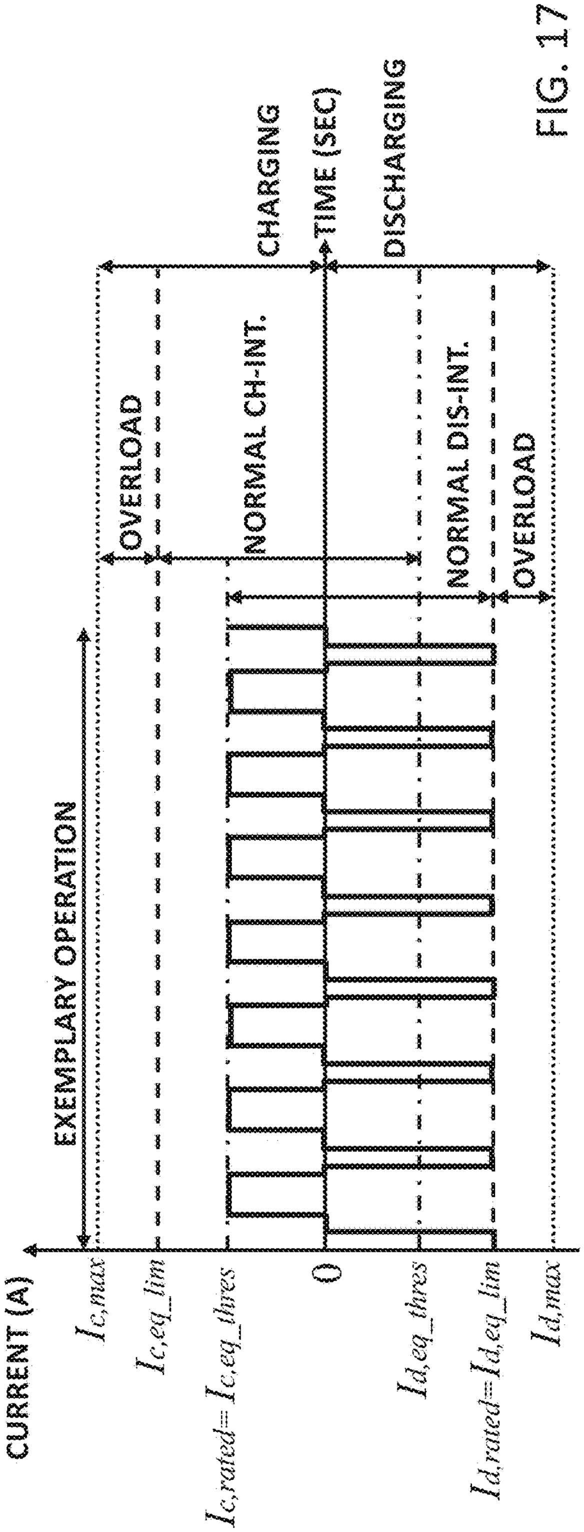
FIG. 17 illustrates a discharge-intensive operation with a bi-directional rated charge-intensive and discharge-intensive profile, according to an embodiment of the present invention.

Energy Storage Cell with Bi-Directional Rated Charge-Intensive and Discharge-Intensive Profiles: In this configuration, the energy storage cell is configured with both the rated charge-intensive profile, defined by equations (16) and (17), and the rated discharge-intensive profile, defined by equations (20) and (21). This dual-mode operation provides flexibility for applications requiring both charge and discharge optimization. FIG. 16 illustrates an energy storage cell with bi-directional rated charge-intensive and discharge-intensive profiles, the cell operating in a charge-intensive mode. The permissible combined charge and discharge current range in this mode is shown as the normal charge-intensive current range 170. Also shown is the permissible combined charge and discharge current range in the discharge-intensive mode, shown as the normal discharge-intensive current range 171. FIG. 17 illustrates the same energy storage cell operating in a discharge-intensive mode.

Figure 18:
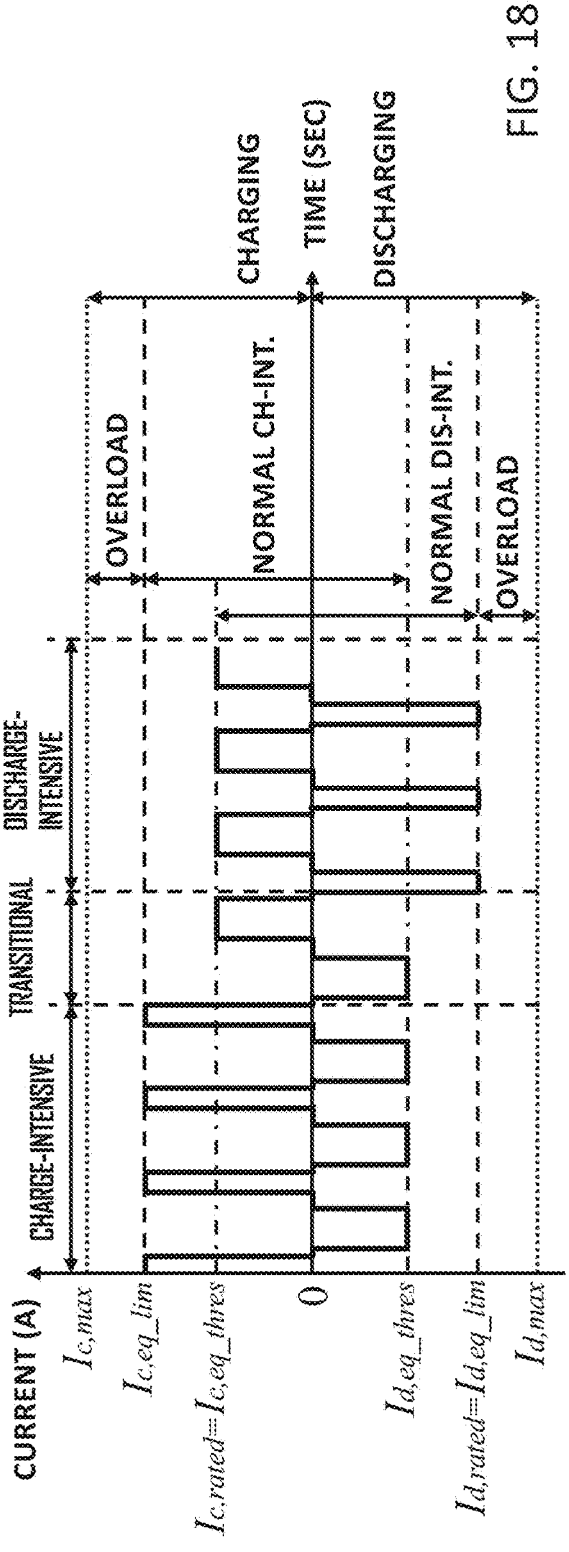
FIG. 18 illustrates a transition from a rated charge-intensive profile to a rated discharge-intensive profile, according to an embodiment of the present invention.

To transition from one profile to the other, the system performs a transitional cycle, ensuring the thermal stability of the cell. For example, one transition steps from the rated charge-intensive profile to the rated discharge-intensive profile. FIG. 18 illustrates the transition from a rated charge-intensive profile to a rated discharge-intensive profile. During this transition, the system, while executing the charge-intensive operational cycles at the rated charge-intensive profile, ensures the cycle completes the full discharge at the current level of the discharge equilibrium threshold ($I_{d,eq\_thres}$). This step allows the cell temperature to stabilize, ensuring that the charge-intensive operation does not introduce excessive thermal deviation. After completing the charge-intensive cycle, the system transitions to the rated discharge-intensive profile starting with a charge at the charge equilibrium threshold ($I_{c,eq\_thres}$). This ensures a smooth transition and thermal stability as the operation shifts to the discharge-intensive mode.

Figure 19:
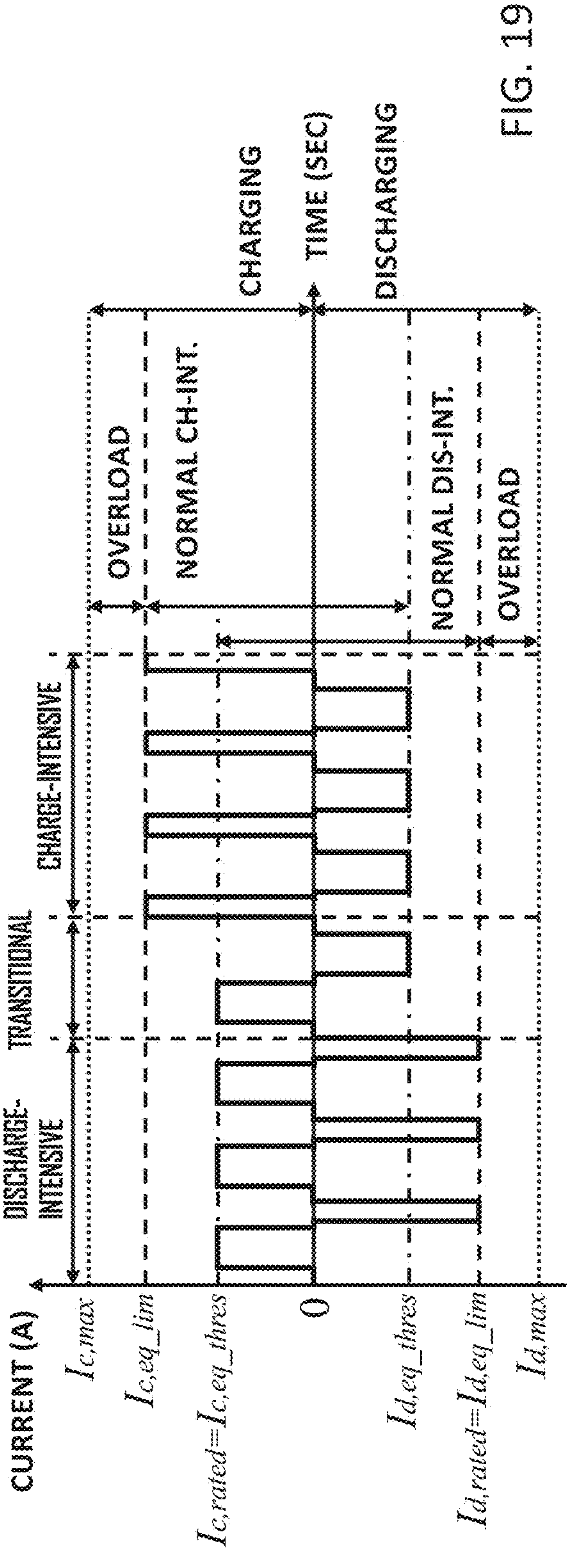
FIG. 19 illustrates a transition from a rated discharge-intensive profile to a rated charge-intensive profile, according to an embodiment of the present invention.

The other transition is from the rated discharge-intensive profile to the rated charge-intensive profile. FIG. 19 illustrates the transition from rated discharge-intensive profile to charge-intensive profile. During this transition, the system, while executing the discharge-intensive operational cycles at the rated discharge-intensive profile, ensures the cycle completes the full charge at the current level of the charge equilibrium threshold ($I_{c,eq\_thres}$). This step allows the cell temperature to stabilize, ensuring the discharge-intensive operation does not introduce excessive thermal deviation. After completing the discharge-intensive cycle, the system transitions to the rated charge-intensive profile starting with a discharge at the discharge equilibrium threshold ($I_{d,eq\_thres}$). This ensures a smooth transition and thermal stability as the operation shifts to the charge-intensive mode.

The transitional period spans an end of the operation of one profile at its corresponding equilibrium threshold and the start of the operation of the following profile at its corresponding equilibrium threshold, with an appropriate rest period between the two. This preferred back-to-back sequence ensures the thermal impact is minimized and the cell achieves equilibrium before fully transitioning into the new rated operating profile. The transitional cycle acts as a buffer, allowing the cell's thermal state to stabilize and avoid abrupt temperature fluctuations that could compromise performance or safety.

Figure 20:
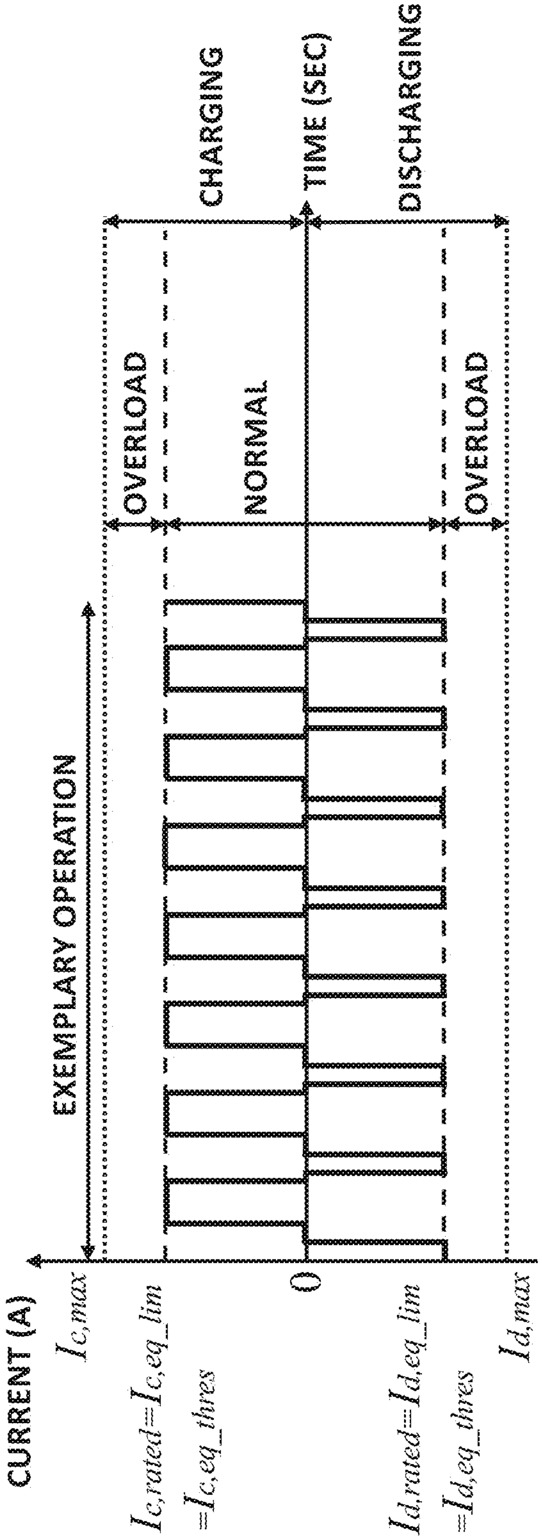
FIG. 20 illustrates energy storage cell operation with a rated symmetric charge-intensive profile.

Energy Storage Cell with a Rated Symmetric Charge-Discharge Profile: FIG. 20 illustrates energy storage cell operation with a rated symmetric charge-discharge profile. In this configuration, the energy storage cell is configured with a rated symmetric charge-discharge profile, where the rated charge and discharge currents are defined by equations (24) and (25). In this profile, the rated charge and discharge currents are equal, ensuring balanced operation and minimal thermal fluctuations.

Figure 21:
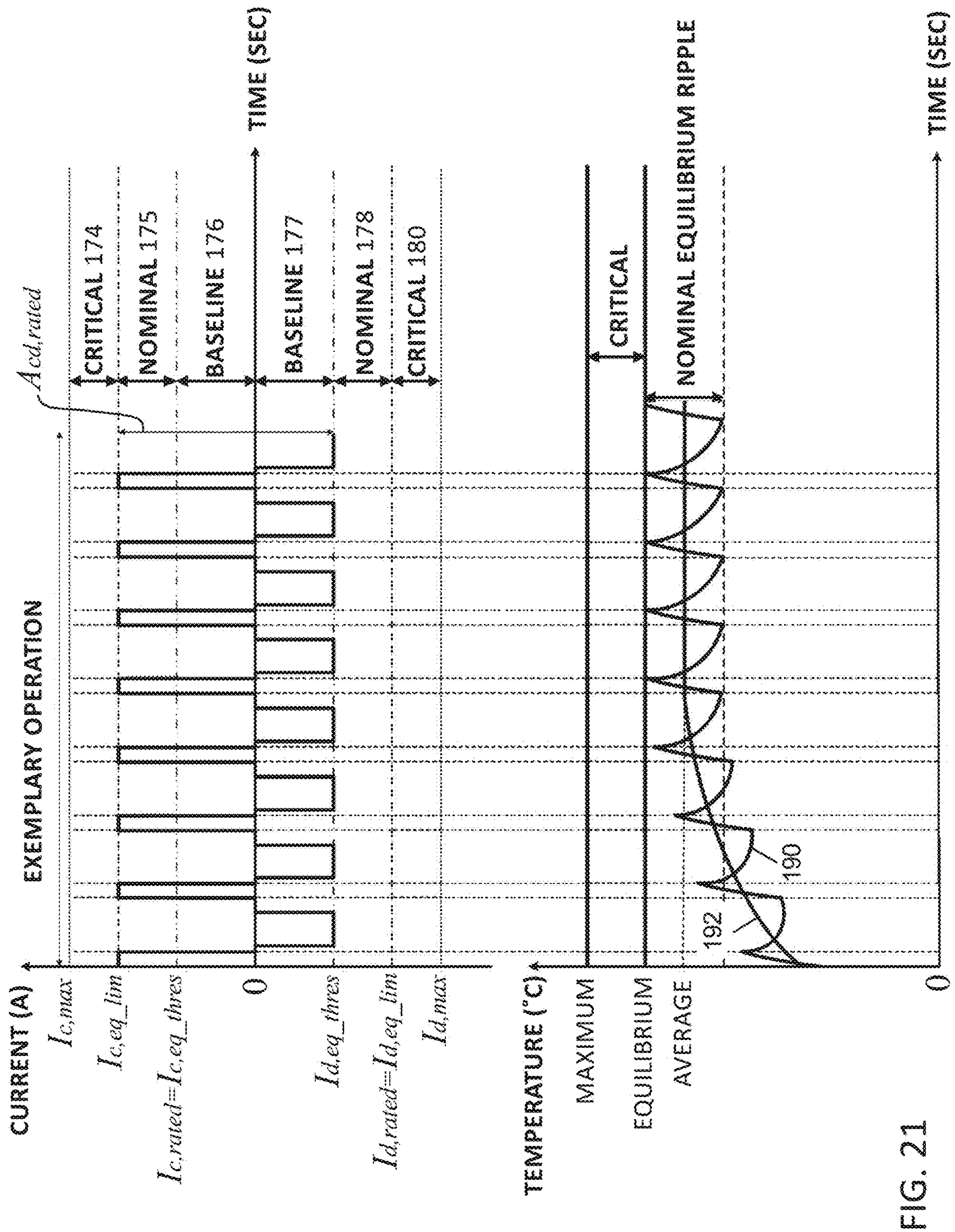
FIG. 21 illustrates standard charge-intensive operation with a rated charge-intensive profile, according to an embodiment of the present invention.

Controls of the Energy Storage Cells with Asymmetric Profiles: FIGS. 21-24 provide explanations on how the profile manager manages the current levels of the energy storage cell to maintain thermal safety and improve efficiency. Referring to FIG. 21, the top panel in the figures illustrates the current behavior during charge and discharge cycles. Various thermal zones corresponding to current ranges are shown, including: critical zones 174, 180 that would lead to excessive cell temperatures; nominal thermal zones 175, 178 for intensive charging and intensive discharging respectively; and baseline thermal zones 166, 177 for recovery charging and recovery discharging respectively.

The bottom panel shows the corresponding cell temperature profile. Cells may be controlled with constant or dynamic $A_{cd}$ control.

Constant $A_{cd}$ control represents the locked difference between the rated charge and discharge currents ($A_{cd,rated}$). With the constant $A_{cd}$ control, the profile manager ensures that $A_{cd}$ remains fixed at the value of $A_{cd,rated}$, maintaining a consistent cell average temperature.

FIG. 21 illustrates a standard charge-intensive operation with the rated charge-intensive profile, where the rated charge and discharge currents are defined by equations (16) and (17). The thermal ripple 190 under this condition is nominal. This operation guarantees that regardless of the cell's pre-operation temperature, as long as the cell is at the rated charge-intensive operation, the cell average temperate 192 in the worst case will be below the permitted equilibrium temperature, and the peak cell temperature will not exceed the cell equilibrium temperature.

The key characteristics of constant $A_{cd}$ control are:

Locked absolute current differential, i.e.

$$A_{cd} = A_{cd,rated} \tag{28}$$

During operation, the profile manager dynamically adjusts the maximum charge and discharge currents while ensuring their absolute differential $A_{cd}$ remains constant at the rated value $A_{cd,rated}$.

When both maximum charge and discharge currents are shifted maintaining $A_{cd}=A_{cd,rated}$, the average cell temperature remains unchanged.

With constant $A_{cd}$ control, the thermal ripple, which is the fluctuation in cell temperature during the operation, increases, as the profile is shifting towards maximum charge limit, $I_{c,max}$, in a charge-intensive operation or maximum discharge limit, $I_{d,max}$, in a discharge-intensive operation, which is equivalent to an increased $M_{cd}$. This is because higher charge or discharge currents inherently generate more rapid heating transitions and lower discharge or charge currents enable more rapid cooling during operation cycles. The maximum thermal ripple is achieved at $M_{cd,max}$, which is the maximum magnitude differential of an asymmetric profile. See FIGS. 22-23.

In additional embodiments, absolute current differential $A_{cd}$ may be locked at values other than the $A_{cd,reated}$ for use in the constant $A_{cd}$ control.

Figure 22:
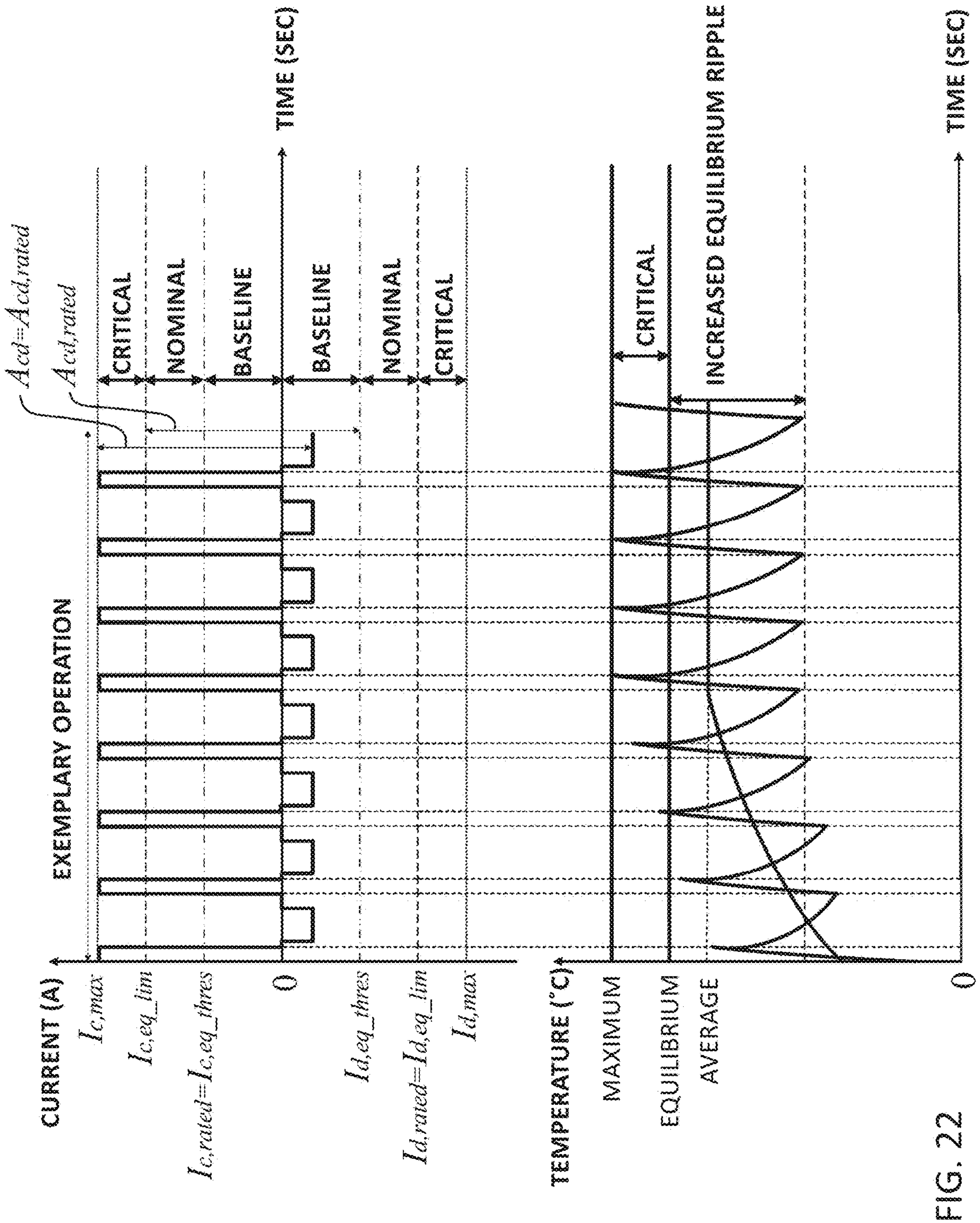
FIG. 22 illustrates an example for a shifted profile with constant absolute current differential ($A_{cd}$) control at maximum asymmetry, according to an embodiment of the present invention.

FIG. 22 illustrates an example for a shifted profile with constant $A_{cd}$ control at maximum asymmetry. In this example, the same cell with same rated profiles operates above the charge equilibrium upper limit $I_{c,eq\_lim}$ with constant $A_{cd}$ control, the cell average temperature remains the same with an increased ripple in the thermal profile. Regulating the maximum current below the maximum charge limit, $I_{c,max}$ ensures that the maximum cell temperature is below the maximum cell temperature.

Figure 23:
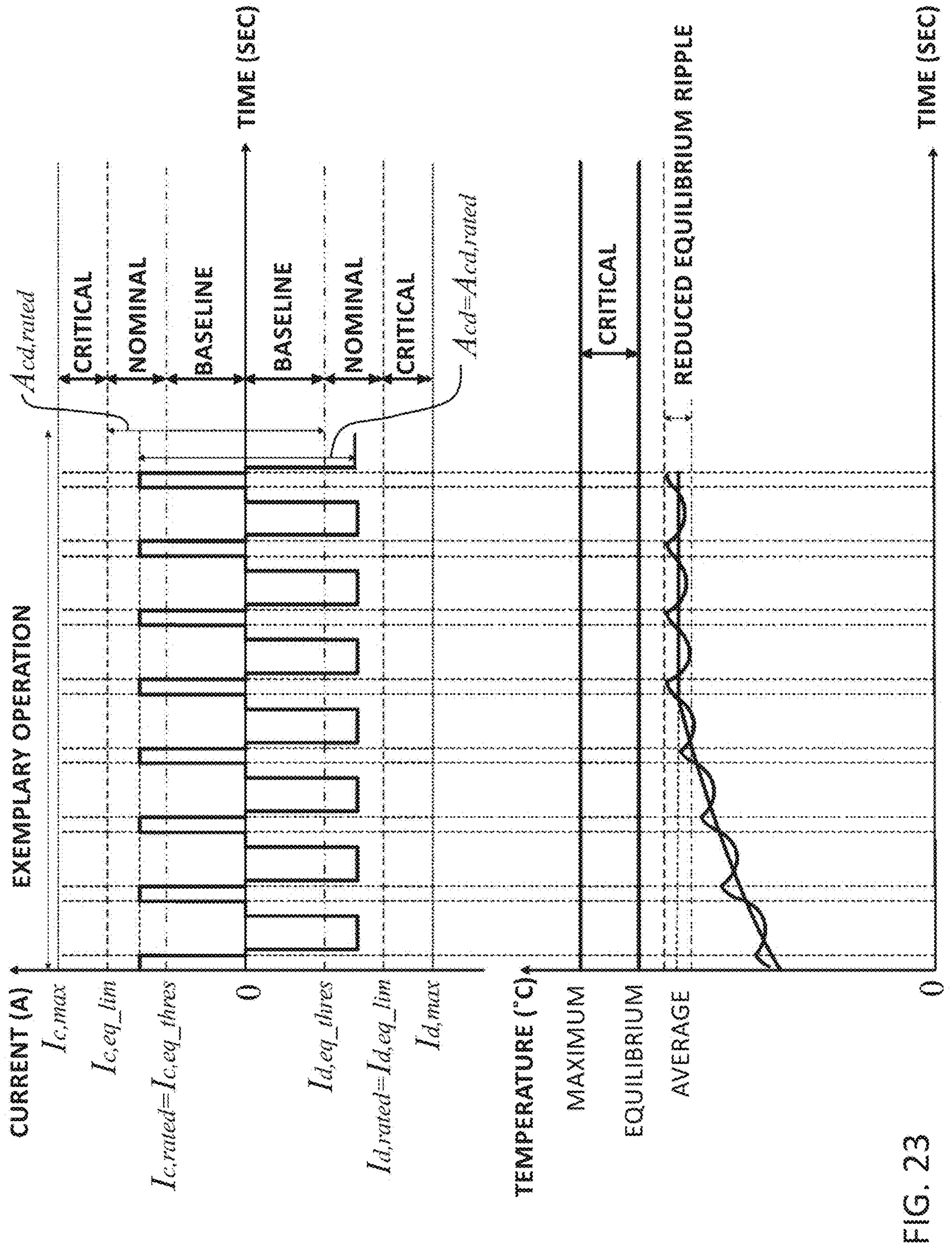
FIG. 23 illustrates an example for a shifted profile with constant $A_{cd}$ control at symmetry, according to an embodiment of the present invention.

FIG. 23 illustrates an example for a shifted profile with constant $A_{cd}$ control at symmetry. With constant $A_{cd}$ control, the thermal ripple decreases as the profile is shifting towards symmetry, which is equivalent to a decreased $M_{cd}$. The minimum thermal ripple is achieved when $M_{cd}=0$.

Dynamic $A_{cd}$ control represents a changing difference between the rated charge and discharge currents during the operation of an energy storage cell.

Figure 24:
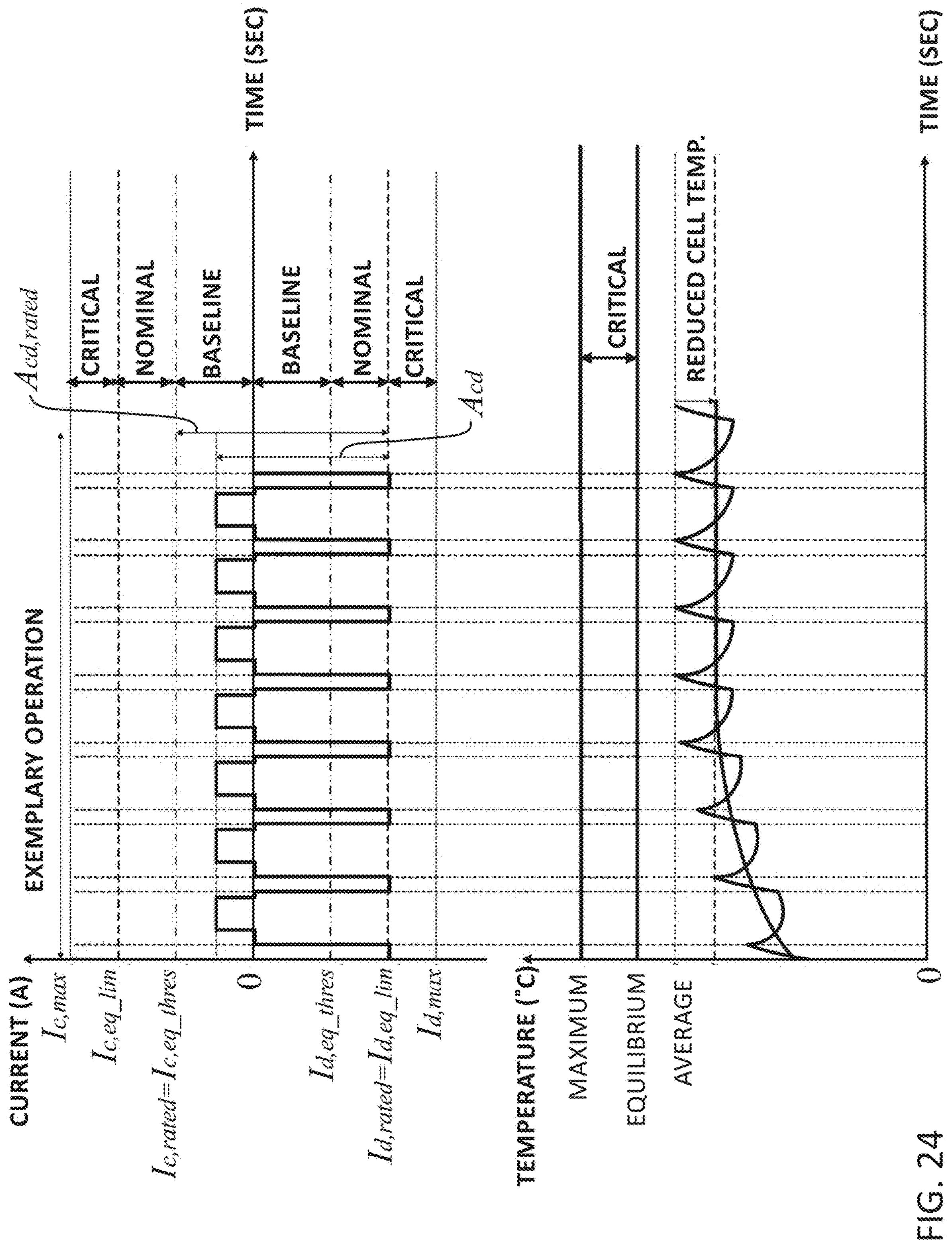
FIG. 24 illustrates the impact of a reduced $A_{cd}$, according to an embodiment of the present invention.

In case 1, $A_{cd}<A_{cd,rated}$ and the cell average temperature is lower than the nominal value for $A_{cd,rated}$. This will allow for reduced thermal stress under specific conditions. FIG. 24 illustrates the impact of the reduced $A_{cd}$.

In case 2, $A_{cd}>A_{cd,rated}$. When $A_{cd}>A_{cd,rated}$, the cell average temperature is higher than the nominal value for $A_{cd,rated}$. In this case, temperature sensor is used to monitor the cell temperature, allowing $A_{cd}>A_{cd,rated}$ only when cell temperature is below the maximum cell temperature. In this case, profile manager with temperature sensor presented in FIG. 13 will be used to maintain safe operation while allowing operational flexibility.

J. Variations

All parameters, quantities and configurations described herein are examples only and may be changed depending on the specific embodiment implemented. For example, the rest periods between charge and discharge may be different to the examples given above. For example, a rest period of 5 seconds or 1 minute may be used. In some embodiments the cell may have an internal temperature sensor that measures the temperature of an interior of the cell. In repeated operation of an energy storage cell according to either a charge-intensive or discharge-intensive profile, the cycles need not be as regular as shown in the examples, and each charge, discharge or charge-discharge pair may be separated by longer or varying rest periods.

Embodiments, depending on their configuration, may exhibit all or fewer than all of the advantages described herein. Other advantages not mentioned may be present in one or more of the embodiments.

Features from any of the embodiments may be combined with features from any of the other embodiments to form another embodiment within the scope of the invention.

In general, unless otherwise indicated, singular elements may be in the plural and vice versa with no loss of generality.

The detailed description has been presented partly in terms of methods or processes, symbolic representations of operations, functionalities and features of the invention. These method descriptions and representations are the means used by those skilled in the art to most effectively convey the substance of their work to others skilled in the art. A software implemented method or process is here, and generally, understood to be a self-consistent sequence of steps leading to a desired result. These steps require physical manipulations of physical quantities. Often, but not necessarily, these quantities take the form of electrical or magnetic signals or values capable of being stored, transferred, combined, compared, and otherwise manipulated. It will be further appreciated that the line between hardware and software is not always sharp, it being understood by those skilled in the art that the software implemented processes described herein may be embodied in hardware, firmware, software, or any combination thereof. Such processes may be controlled by coded instructions such as microcode and/or by stored programming instructions in one or more tangible or non-transient media readable by a computer or processor. The code modules may be stored in any computer storage system or device, such as hard disk drives, optical drives, solid state memories, etc. The methods may alternatively be embodied partly or wholly in specialized computer hardware, such as ASIC or FPGA circuitry.

It will be clear to one having skill in the art that further variations to the specific details disclosed herein can be made, resulting in other embodiments that are within the scope of the invention disclosed. Two or more steps in the flowcharts may be performed in a different order, other steps may be added, or one or more may be removed without altering the main outcome of the process or function of the invention. Flowcharts from different figures may be combined in different ways. Modules may be divided into constituent modules or combined into larger modules.

Throughout the description, specific details have been set forth in order to provide a more thorough understanding of embodiments of the invention. However, the invention may be practiced without these specific details. In other instances, well known elements have not been shown or described in detail and repetitions of steps and features have been omitted to avoid unnecessarily obscuring the invention. Accordingly, the specification and drawings are to be regarded in an illustrative, rather than a restrictive, sense. It will be clear to one having skill in the art that variations to the details disclosed herein can be made, resulting in other embodiments that are within the scope of the invention disclosed. Accordingly, the scope of the invention is to be construed in accordance with the substance defined by the claims.

The invention claimed is:

1. An energy storage system comprising:

a cell;

a processor;

a computer readable memory storing a profile for the cell, wherein the profile includes a charge-intensive profile and/or a discharge intensive profile, wherein:

the charge-intensive profile, when included, has a charge equilibrium upper limit and a discharge equilibrium threshold that has a smaller magnitude than the charge equilibrium upper limit;

the discharge-intensive profile, when included, has a discharge equilibrium upper limit and a charge equilibrium threshold that has a smaller magnitude than the discharge equilibrium upper limit;

computer readable instructions stored in the computer readable memory which, when executed by the processor, cause the energy storage system to:

operate the cell according to the charge-intensive profile by charging the cell at a current not greater in magnitude than the charge equilibrium upper limit and discharging the cell at a current not exceeding the discharge equilibrium threshold; or operate the cell according to the discharge-intensive profile by discharging the cell at a current not greater in magnitude than the discharge equilibrium upper limit and charging the cell at a current not exceeding the charge equilibrium threshold; or operate the cell according to one of the charge-intensive profile and the discharge-intensive profile for multiple charge and discharge cycles then operate the cell according to the other of the charge-intensive profile and the discharge-intensive profile for multiple further charge and discharge cycles.

2. The energy storage system of claim 1 wherein:

the profile includes the charge-intensive profile; and the computer readable instructions, when executed by the processor, further cause the energy storage system to repeatedly charge and discharge the cell, the charge being at the charge equilibrium upper limit and the discharge being at the discharge equilibrium threshold.

3. The energy storage system of claim 2 wherein:

the cell is a supercapacitor; and the charge is at an equivalent C-rate of over 50 C.

4. The energy storage system of claim 2 wherein the computer readable instructions, when executed by the processor, further cause the energy storage system to:

operate the cell according to the charge-intensive profile until a discharge at the discharge equilibrium threshold has been completed, then operate the cell according to the discharge-intensive profile starting with a charge to the charge equilibrium threshold.

5. The energy storage system of claim 1 wherein:

the profile includes the discharge-intensive profile; and the computer readable instructions, when executed by the processor, further cause the energy storage system to repeatedly charge and discharge the cell, the charge being at the charge equilibrium threshold and the discharge being at the discharge equilibrium upper limit.

6. The energy storage system of claim 5 wherein:

the cell is a supercapacitor; and the discharge is at an equivalent C-rate of over 50 C.

7. The energy storage system of claim 5 wherein the computer readable instructions, when executed by the processor, further cause the energy storage system to:

operate the cell according to the discharge-intensive profile until a charge at the charge equilibrium threshold has been completed, then operate the cell according to the charge-intensive profile starting with a discharge to the discharge equilibrium threshold.

8. The energy storage system of claim 1 wherein an absolute current differential is defined:

for the charge-intensive profile, by subtracting the discharge equilibrium threshold, expressed as a negative value, from the charge equilibrium upper limit; or for the discharge-intensive profile, by subtracting the discharge equilibrium upper limit, expressed as another negative value, from the charge equilibrium threshold; and the computer readable instructions, when executed by the processor, further cause the energy storage system to repeatedly charge and discharge the cell, at currents that differ by the absolute current differential, at a charge current that differs from the charge equilibrium upper limit and the charge equilibrium threshold, and at a discharge current that differs from the discharge equilibrium upper limit and the discharge equilibrium threshold.

9. The energy storage system of claim 1 wherein the cell is a supercapacitor.

* * * * *